United States Patent
Nonaka et al.

(10) Patent No.: US 11,938,524 B2
(45) Date of Patent: Mar. 26, 2024

(54) SUBSTRATE PROCESSING APPARATUS AND SUBSTRATE PROCESSING METHOD

(71) Applicant: Tokyo Electron Limited, Tokyo (JP)

(72) Inventors: Jun Nonaka, Kumamoto (JP); Mitsunori Nakamori, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 183 days.

(21) Appl. No.: 17/442,137

(22) PCT Filed: Aug. 17, 2020

(86) PCT No.: PCT/JP2020/030933
§ 371 (c)(1),
(2) Date: Sep. 23, 2021

(87) PCT Pub. No.: WO2021/039449
PCT Pub. Date: Mar. 4, 2021

(65) Prior Publication Data
US 2022/0168785 A1 Jun. 2, 2022

(30) Foreign Application Priority Data

Aug. 29, 2019 (JP) .................................. 2019-157255

(51) Int. Cl.
*B08B 3/10* (2006.01)
(52) U.S. Cl.
CPC ...................................... *B08B 3/10* (2013.01)
(58) Field of Classification Search
CPC ... B08B 3/10; H01L 21/67057; H01L 21/304; H01L 21/67028; H01L 21/67051; H01L 21/67757; H01L 21/67034; H01L 21/67086; H01L 21/02057; H01L 21/67745
See application file for complete search history.

(56) References Cited

U.S. PATENT DOCUMENTS

| 2008/0072931 A1* | 3/2008 | Kimura ..................... B08B 3/08 134/61 |
| 2016/0089696 A1* | 3/2016 | Kimura ............. H01L 21/67028 427/299 |
| 2018/0090343 A1* | 3/2018 | Yamaguchi ....... H01L 21/67739 |

FOREIGN PATENT DOCUMENTS

| JP | 2001-144065 A | | 5/2001 |
| JP | 2001144065 A | * | 5/2001 |
| JP | 2014-197638 A | | 10/2014 |
| JP | 2018-56155 A | | 4/2018 |
| JP | 2019-160957 | * | 9/2019 |

OTHER PUBLICATIONS

International Search Report and Written Opinion dated Oct. 27, 2020, received for PCT Application PCT/JP2020/030933, Filed on Aug. 17, 2020, 9 pages including English Translation.

* cited by examiner

*Primary Examiner* — Alexander Markoff
(74) *Attorney, Agent, or Firm* — XSENSUS LLP

(57) ABSTRACT

A substrate processing apparatus includes a liquid processing tank, and a hydrophobizing gas supply unit. The liquid processing tank stores a processing liquid and dips a plurality of substrates in the processing liquid to liquid-process the plurality of substrates. The hydrophobizing gas supply unit supplies a gas of a hydrophobizing agent to the plurality of substrates after liquid processing thereof.

14 Claims, 12 Drawing Sheets

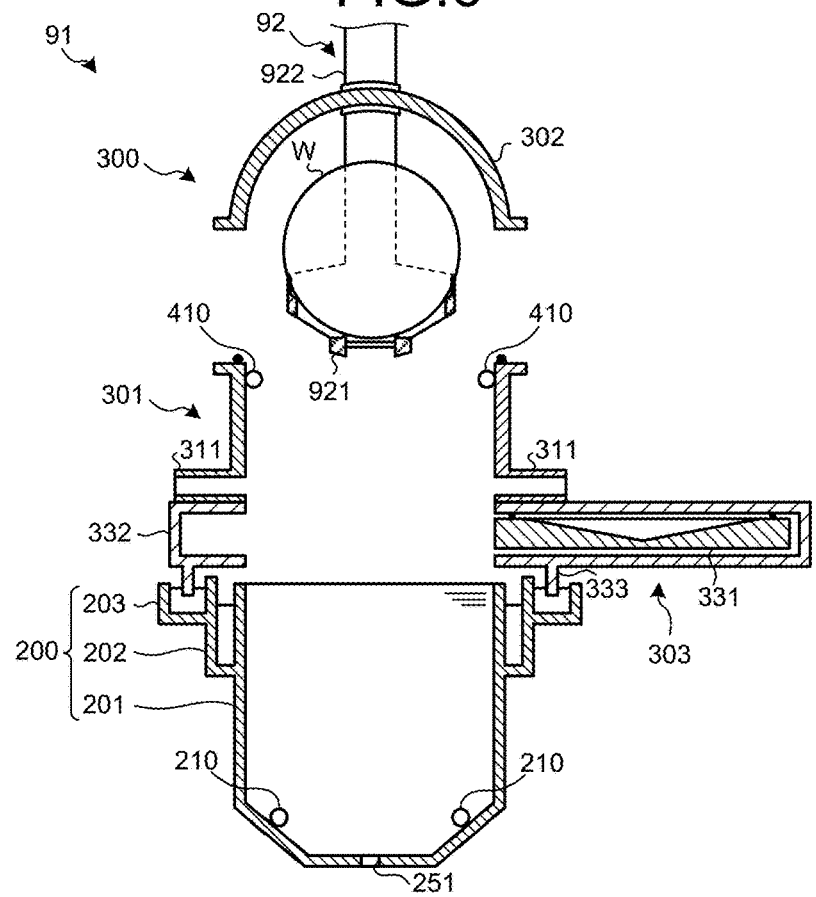
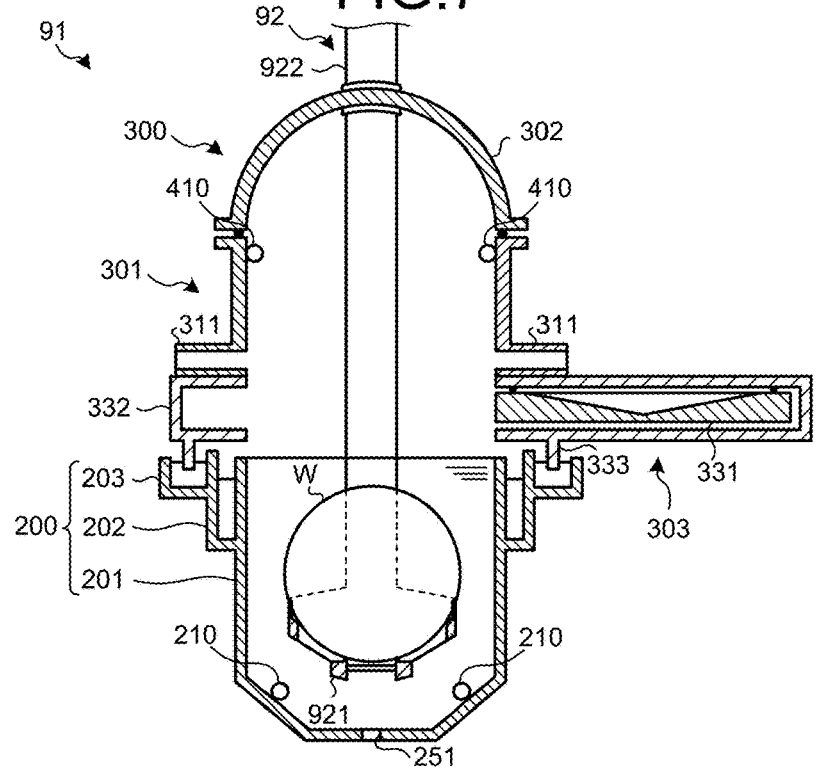

HYDROPHOBIZING GAS

SUBSTRATE PROCESSING APPARATUS AND SUBSTRATE PROCESSING METHOD

CROSS-REFERENCE TO RELATED APPLICATIONS

This application is a national stage application of International Application No. PCT/JP2020/030933 filed on Aug. 17, 2020, which designates the United States, the entire contents of which are herein incorporated by reference, and which is based upon and claims the benefit of priority to Japanese Patent Application No. 2019-157255 filed on Aug. 29, 2019, the entire contents of which are herein incorporated by reference.

FIELD

The present disclosure relates to a substrate processing apparatus and a substrate processing method.

BACKGROUND

In a drying process that dries a substrate, a circuit pattern (that will simply be called a "pattern" below) that is formed on a surface of the substrate may be collapsed by surface tension of a liquid. Hence, a technique has been proposed for hydrophobizing a surface of a substrate prior to a drying process. According to such a technique, a surface of a substrate is hydrophobized in such a manner that surface tension does not readily act on a pattern, so that it is possible to prevent or reduce collapse of the pattern.

Patent Literature 1 discloses a technique for supplying a hydrophobizing processing liquid to a surface of a substrate so as to hydrophobize the surface of the substrate in a single-wafer-type substrate processing apparatus that processes a substrate one by one.

CITATION LIST

Patent Literature

Patent Literature 1: Japanese Patent Application Publication No. 2014-197638

SUMMARY

Technical Problem

The present disclosure provides a technique that is capable of preventing or reducing collapse of a pattern in a batch-type substrate processing apparatus that processes a plurality of substrates collectively.

Solution to Problem

A substrate processing apparatus according to an aspect of the present disclosure includes a liquid processing tank and a hydrophobizing gas supply unit. The liquid processing tank stores a processing liquid and dips a plurality of substrates in the processing liquid to liquid-process the plurality of substrates. The hydrophobizing gas supply unit supplies a gas of a hydrophobizing agent to the plurality of substrates after liquid processing thereof.

Advantageous Effects of Invention

According to the present disclosure, it is possible to prevent or reduce collapse of a pattern in a batch-type substrate processing apparatus that processes a plurality of substrates collectively.

BRIEF DESCRIPTION OF DRAWINGS

FIG. 6 is a diagram that illustrates an example of an operation of a carrying-in process.

FIG. 7 is a diagram that illustrates an example of an operation of a rinsing process.

DESCRIPTION OF EMBODIMENTS

Figure 1:
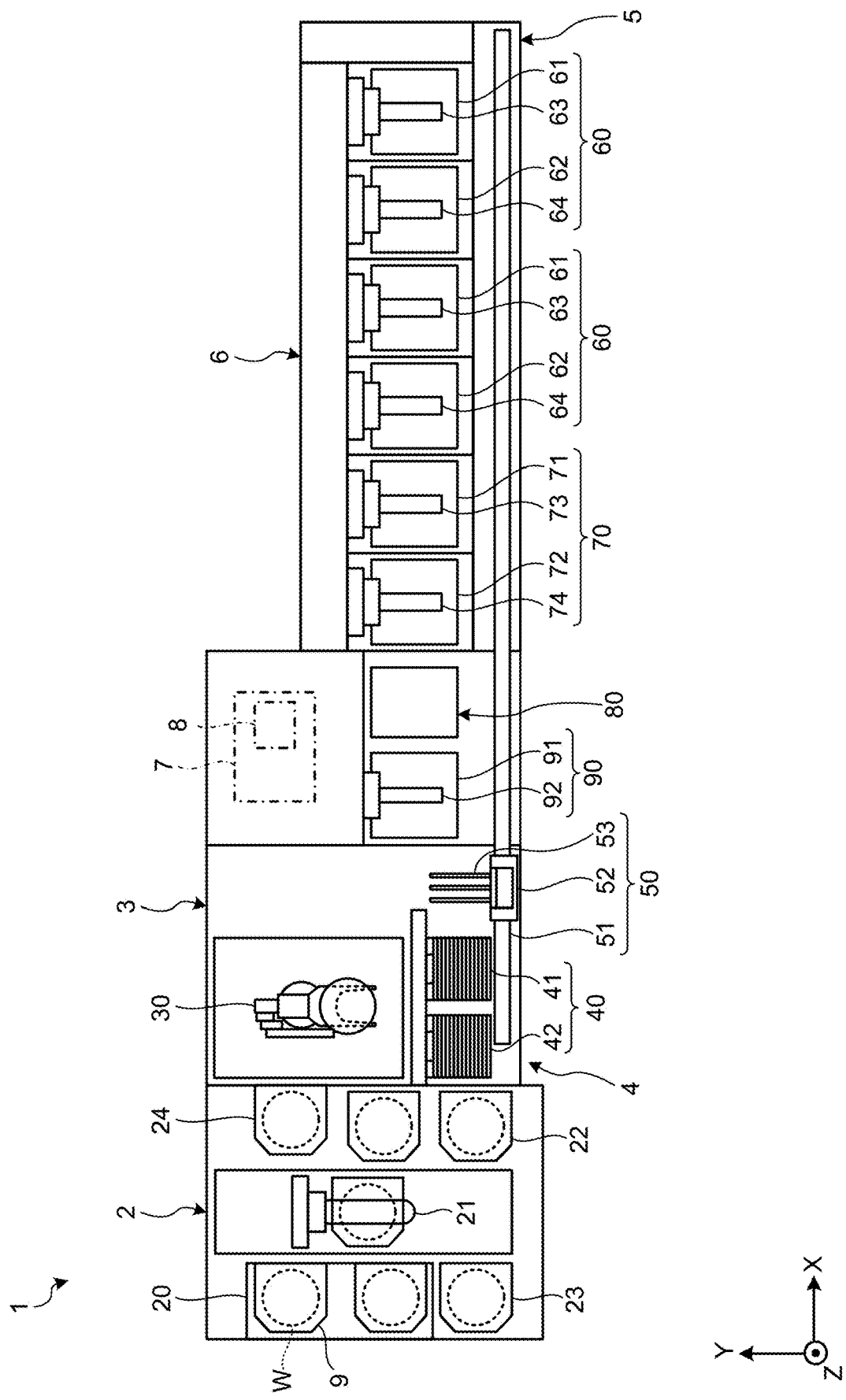
FIG. 1 is a plan view of a substrate processing apparatus according to a first embodiment.

Hereinafter, a mode(s) (that will be described as "an embodiment(s)" below) for implementing a substrate processing apparatus and a substrate processing method according to the present disclosure will be explained in detail with reference to the drawing(s). Additionally, a substrate processing apparatus and a substrate processing method according to the present disclosure are not limited by such an embodiment(s). Furthermore, it is possible to combine respective embodiments appropriately as long as process contents thereof are not inconsistent. Furthermore, in each embodiment as provided below, an identical site will be provided with an identical sign so as to omit a redundant explanation(s) thereof.

Furthermore, although an expression of "constant", "orthogonal", "perpendicular", "parallel" may be used in an embodiment(s) as illustrated below, such an expression does not have to be strictly "constant", "orthogonal", "perpendicular", or "parallel". That is, each expression as described above allows, for example, a shift of manufacturing accuracy, placement accuracy, or the like.

Furthermore, each drawing that will be referred to below may illustrate an orthogonal coordinate system where a direction of an X-axis, a direction of a Y-axis, and a direction of a Z-axis that are orthogonal to one another are defined and a positive direction of the Z-axis is provided as a vertically upward direction, for a sake of clarity of explanation.

First Embodiment

<Configuration of Substrate Processing Apparatus>

First, a configuration of a substrate processing apparatus according to a first embodiment will be explained with reference to FIG. 1. FIG. 1 is a plan view of a substrate processing apparatus 1 according to a first embodiment.

As illustrated in FIG. 1, the substrate processing apparatus 1 according to a first embodiment includes a carrier carrying-in/out section 2, a lot formation section 3, a lot placement section 4, a lot transfer section 5, a lot processing section 6, and a controller 7.

The carrier carrying-in/out section 2 includes a carrier stage 20, a carrier transfer mechanism 21, carrier stocks 22, 23, and a carrier placing pedestal 24.

The carrier stage 20 places thereon a plurality of carriers 9 that are transferred from an outside thereof. A carrier 9 is a container that contains a plurality of (for example, 25) wafers W one above the other and side by side in a horizontal attitude thereof. The carrier transfer mechanism 21 executes transfer of a carrier 9 among the carrier stage 20, the carrier stocks 22, 23, and the carrier placing pedestal 24.

A plurality of wafers W before being processed are carried out from a carrier 9 that is placed on the carrier placing pedestal 24 to the lot processing section 6 by a substrate transfer mechanism 30 as described later. Furthermore, a plurality of wafers W that have been processed are carried in from the lot processing section 6 to a carrier 9 that is placed on the carrier placing pedestal 24 by a substrate transfer mechanism 30.

The lot formation section 3 has the substrate transfer mechanism 30 and forms a lot. A lot is composed of a plurality of (for example, 50) wafers W that are simultaneously processed by combining wafers W that are contained in one or more carriers 9. A plurality of wafers W that form one lot are arrayed at a regular interval(s) in a state where mutual plate surfaces thereof are opposed.

The substrate transfer mechanism 30 transfers a plurality of wafers W between a carrier 9 that is placed on the carrier placing pedestal 24 and the lot placement section 4.

The lot placement section 4 has a lot transfer pedestal 40 and temporarily places (waits) a lot that is transferred between the lot formation section 3 and the lot processing section 6 by the lot transfer section 5. The lot transfer pedestal 40 has a carrying-in-side lot placing pedestal 41 that places thereon a lot before being processed that is formed by the lot formation section 3 and a carrying-out-side lot placing pedestal 42 that places thereon a lot that have been processed by the lot processing section 6. A plurality of wafers W for one lot are placed back and forth and side by side in a standing attitude thereof on the carrying-in-side lot placing pedestal 41 and the carrying-out-side lot placing pedestal 42.

The lot transfer section 5 has a lot transfer mechanism 50 and executes transfer of a lot between the lot placement section 4 and the lot processing section 6 and/or in an inside of the lot processing section 6. The lot transfer mechanism 50 has a rail 51, a moving body 52, and a substrate holding body 53.

The rail 51 is arranged over the lot placement section 4 and the lot processing section 6 along a direction of an X-axis. The moving body 52 is configured to be movable along the rail 51 while holding a plurality of wafers W. The substrate holding body 53 is provided on the moving body 52 and holds a plurality of wafers W that are arranged back and forth in a standing attitude thereof.

The lot processing section 6 collectively executes an etching process, a cleaning process, a drying process, and/or the like for a plurality of wafers W for one lot. For the lot processing section 6, two etching process devices 60, a cleaning process device 70, a substrate holding body cleaning process device 80, and a drying process device 90 are provided side by side along the rail 51.

The etching process device 60 collectively executes an etching process for a plurality of wafers W for one lot. The cleaning process device 70 collectively executes a cleaning process for a plurality of wafers W for one lot. The substrate holding body cleaning process device 80 executes a cleaning process for the substrate holding body 53. The drying process device 90 collectively executes a drying process for a plurality of wafers W for one lot. Additionally, numbers of the etching process device 60, the cleaning process device 70, the substrate holding body cleaning process device 80, and the drying process device 90 are not limited to those in an example of FIG. 1.

The etching process device 60 includes a processing tank 61 for an etching process, a processing tank 62 for a rinsing process, and substrate lifting/lowering mechanisms 63, 64.

The processing tank 61 is capable of containing wafers W for one lot that are arrayed in a standing attitude thereof and stores a chemical liquid for an etching process (that will also be called an "etching liquid" below) therein. A detail of the processing tank 61 will be described later.

The processing tank 62 stores a processing liquid for a rinsing process (such as a deionized water) therein. The substrate lifting/lowering mechanisms 63, 64 hold a plurality of wafers W that form a lot back and forth and side by side in a standing attitude thereof.

The etching process device 60 holds, by a substrate lifting/lowering mechanism 63, and dips in an etching liquid in the processing tank 61, a lot that is transferred by the lot transfer section 5, so as to execute an etching process. An etching process is executed, for example, for about 1 hour to 3 hours.

A lot that has been etching-processed in the processing tank 61 is transferred to the processing tank 62 by the lot transfer section 5. Then, the etching process device 60 holds, by a substrate lifting/lowering mechanism 64, and dips in a rinsing liquid in the processing tank 62, a transferred lot, so as to execute a rinsing process. A lot that has been rinsing-processed in the processing tank 62 is transferred to a processing tank 71 of the cleaning process device 70 by the lot transfer section 5.

The cleaning process device 70 includes a processing tank 71 for cleaning, a processing tank 72 for a rinsing process, and substrate lifting/lowering mechanisms 73, 74. The processing tank 71 for cleaning stores a chemical liquid for cleaning (that will also be called a "cleaning chemical liquid" below). A cleaning chemical liquid is, for example, SC-1 (a mixed liquid of ammonia, hydrogen peroxide, and water) or the like.

The processing tank 72 for a rinsing process stores a processing liquid for a rinsing process (such as a deionized water). The substrate lifting/lowering mechanisms 73, 74 hold a plurality of wafers W for one lot back and forth and side by side in a standing attitude thereof.

The cleaning process device 70, holds by a substrate lifting/lowering mechanism 73, and dips in a cleaning liquid in the processing tank 71, a lot that has been transferred by the lot transfer section 5, so as to execute a cleaning process.

A lot that has been cleaning-processed in the processing tank 71 is transferred to the processing tank 72 by the lot transfer section 5. Then, the cleaning process device 70 holds, by a substrate lifting/lowering mechanism 74, and dips in a rinsing liquid in the processing tank 72, a transferred lot, so as to execute a rinsing process. A lot that has been rinsing-processed in the processing tank 72 is transferred to a processing tank 91 of the drying process device 90 by the lot transfer section 5.

The drying process device 90 has a processing tank 91 and a substrate lifting/lowering mechanism 92. The processing tank 91 is supplied with a processing gas for a drying process. The substrate lofting/lowering mechanism 92 holds a plurality of wafers W for one lot back and forth and side by side in a standing attitude thereof.

The drying process device 90 holds, by the substrate lifting/lowering mechanism 92, a lot that has been transferred by the lot transfer section 5, and executes a drying process by using a processing gas for a drying process that is supplied to an inside of the processing tank 91. A lot that has been drying-processed in the processing tank 91 is transferred to the lot placement section 4 by the lot transfer section 5.

In the substrate processing apparatus 1 according to a first embodiment, a plurality of wafers W for one lot are hydrophobized in such a drying process, so that collapse of patterns that are formed on surfaces of such a plurality of wafers W is prevented or reduced. Such a point will be described later.

The substrate holding body cleaning process device 80 supplies a processing liquid for cleaning, and further, supplies a drying gas, to the substrate holding body 53 of the lot transfer mechanism 50, so as to execute a cleaning process for the substrate holding body 53.

The controller 7 controls an operation of each section (such as the carrier carrying-in/out section 2, the lot formation section 3, the lot placement section 4, the lot transfer section 5, or the lot processing section 6) of the substrate processing apparatus 1. The controller 7 controls an operation of each section of the substrate processing apparatus 1 based on a signal(s) from a switch, various types of sensors, and/or the like.

The controller 7 includes a microcomputer that has a CPU (Central Processing Unit), a ROM (Read Only Memory), a RAM (Random Access Memory), an input/output port, and the like, and/or various types of circuits, and reads and executes a program that is stored in a non-illustrated storage, so as to control an operation of the substrate processing apparatus 1. The controller 7 has a computer-readable storage medium 8. The storage medium 8 stores an aforementioned program that controls various types of processes that are executed in the substrate processing apparatus 1. A program may be stored in the computer-readable storage medium 8 or may be installed in the storage medium 8 of the controller 7 from another storage medium.

For the computer-readable storage medium 8, for example, a hard disk (HD), a flexible disk (FD), a compact disk (CD), a magnetooptical disk (MO), a memory card, or the like is provided.

<Configuration of Processing Tank for Etching Process>

Figure 2:
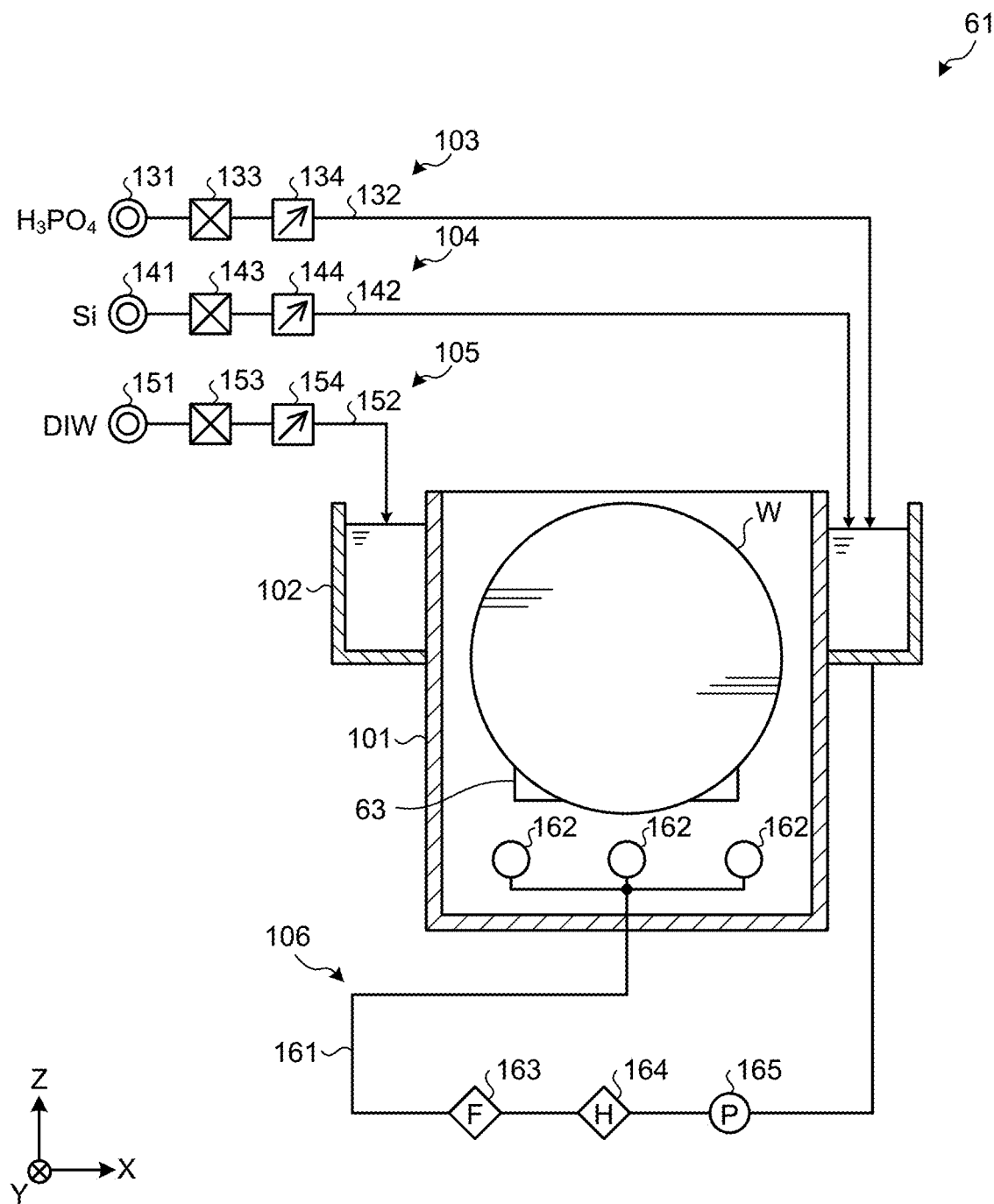
FIG. 2 is a schematic cross-sectional view of a processing tank for an etching process according to a first embodiment.

Next, a processing tank 61 that is used for an etching process will be explained with reference to FIG. 2. FIG. 2 is a schematic cross-sectional view of a processing tank 61 for an etching process according to a first embodiment.

In the processing tank 61, an etching process is executed that selectively etches, among a silicon nitride film (SiN) and a silicon oxide film ($SiO_2$) that are formed on a wafer W, the silicon nitride film, by using a predetermined etching liquid. In such an etching process, a solution where a silicon (Si)-containing compound is added to an aqueous solution of phosphoric acid ($H_3PO_4$) and a concentration of silicon therein is adjusted is used as an etching liquid.

For a method that adjusts a concentration of silicon in an etching liquid, it is possible to use a method that dips a dummy substrate in an aqueous solution of phosphoric acid so as to dissolve silicon therein (seasoning) and/or a method that dissolves a silicon-containing compound such as colloidal silica in an aqueous solution of phosphoric acid. Furthermore, an aqueous solution of a silicon-containing compound may be added to an aqueous solution of phosphoric acid so as to adjust a concentration of silicon therein.

As illustrated in FIG. 2, the processing tank 61 for an etching process includes an inner tank 101 and an outer tank 102. The inner tank 101 is a box-shaped tank that is open-topped and stores an etching liquid in an inside thereof. A lot that is formed by a plurality of wafers W is dipped in the inner tank 101. The outer tank 102 is open-topped and is arranged around an upper part of the inner tank 101. An etching liquid that overflows the inner tank 101 flows into the outer tank 102.

The processing tank 61 includes a phosphoric acid aqueous solution supply system 103, a silicon supply system 104, and a DIW supply system 105.

The phosphoric acid aqueous solution supply system 103 has a phosphoric acid aqueous solution supply source 131, a supply route 132, a valve 133, and a flow rate regulator 134. The phosphoric acid aqueous solution supply source 131 supplies thereto an aqueous solution of phosphoric acid that is concentrated in such a manner that a concentration of phosphoric acid therein is a desired concentration. The supply route 132 connects the phosphoric acid aqueous solution supply source 131 and the outer tank 102 and supplies an aqueous solution of phosphoric acid from the phosphoric acid aqueous solution supply source 131 to the outer tank 102. The valve 133 is provided on the supply route 132 and opens or closes the supply route 132. The flow rate regulator 134 is provided on the supply route 132 and regulates a flow rate of an aqueous solution of phosphoric acid that flows through the supply route 132.

The silicon supply system 104 has a silicon supply source 141, a supply route 142, a valve 143, and a flow rate regulator 144. The silicon supply source 141 supplies an aqueous solution of a silicon-containing compound thereto. The supply route 142 connects the silicon supply source 141 and the outer tank 102 and supplies an aqueous solution of a silicon-containing compound from the silicon supply source 141 to the outer tank 102. The valve 143 is provided on the supply route 142 and opens or closes the supply route 142. The flow rate regulator 144 is provided on the supply route 142 and regulates a flow rate of an aqueous solution of a silicon-containing compound that flows through the supply route 142. An amount of supply of an aqueous solution of a silicon-containing compound is regulated by the flow rate regulator 144, so that a concentration of silicon in an etching liquid is adjusted.

The DIW supply system 105 has a DIW supply source 151, a supply route 152, a valve 153, and a flow rate regulator 154. The DIW supply system 105 supplies DIW (DeIonized Water: deionized water) to the outer tank 102 in order to resupply thereto water that is vaporized by heating an etching liquid. The supply route 152 connects the DIW supply source 151 and the outer tank 102 and supplies DIW at a predetermined temperature from the DIW supply source 151 to the outer tank 102. The valve 153 is provided on the supply route 152 and opens or closes the supply route 152. The flow rate regulator 154 is provided on the supply route 152 and regulates a flow rate of DIW that flows through the supply route 152. An amount of supply of DIW is regulated by the flow rate regulator 154, so that a temperature of an etching liquid, a concentration of phosphoric acid, and a concentration of silicon are adjusted.

The processing tank 61 includes a circulation unit 106. The circulation unit 106 circulates an etching liquid between the inner tank 101 and the outer tank 102. The circulation unit 106 includes a circulation route 161, a plurality of processing liquid supply nozzles 162, a filter 163, a heater 164, and a pump 165.

The circulation route 161 connects the outer tank 102 and the inner tank 101. One end of the circulation route 161 is connected to the outer tank 102 and another end of the circulation route 161 is connected to the plurality of processing liquid supply nozzles 162 that are arranged in an inside of the inner tank 101.

The filter 163, the heater 164, and the pump 165 are provided on the circulation route 161. The filter 163 removes an impurity/impurities from an etching liquid that flows through the circulation route 161. The heater 164 heats an etching liquid that flows through the circulation route 161 to a temperature that is suitable for an etching process. The pump 165 pumps an etching liquid in the outer tank 102 to the circulation route 161. The pump 165, the heater 164, and the filter 163 are provided from an upstream side in this order.

The circulation unit 106 sends an etching liquid from the outer tank 102 to an inside of the inner tank 101 through the circulation route 161 and the plurality of processing liquid supply nozzles 162. An etching liquid that is sent to an inside of the inner tank 101 overflows the inner tank 101 so as to flow out to the outer tank 102 again. Thus, an etching liquid is circulated between the inner tank 101 and the outer tank 102.

Additionally, the circulation unit 106 may heat an etching liquid by the heater 164 so as to provide the etching liquid in a boiling state thereof.

<Configuration of Processing Tank for Drying Process>

Figure 3:
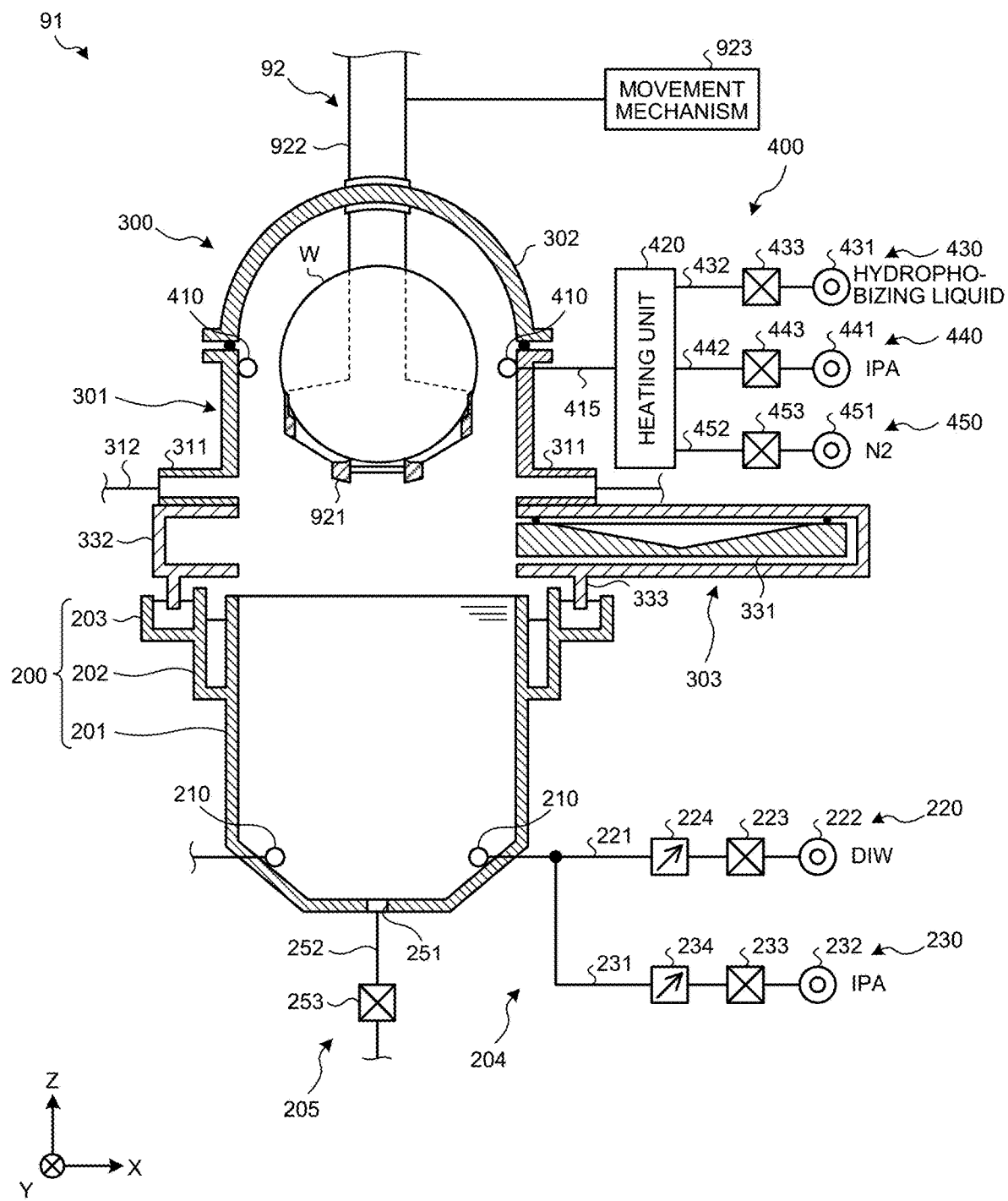
FIG. 3 is a schematic cross-sectional view of a processing tank for a drying process according to a first embodiment.

Next, a processing tank 91 that is used for a drying process will be explained with reference to FIG. 3. FIG. 3 is a schematic cross-sectional view of a processing tank 91 for a drying process according to a first embodiment.

As illustrated in FIG. 3, the processing tank 91 includes a liquid processing tank 200, a drying process tank 300, and a gas supply unit 400.

(For Liquid Processing Tank 200)

The liquid processing tank 200 includes a storage tank 201, an overflow tank 202, and a seal tank 203. The liquid processing tank 200 is capable of containing a plurality of wafers W for one lot that are provided side by side in a perpendicular attitude (a state of a longitudinal direction) thereof. In such a liquid processing tank 200, a plurality of wafers W for one lot are dipped in a processing liquid that is stored in an inside thereof, so as to execute a liquid process where the plurality of wafers W for one lot are processed collectively. Herein, DIW is used as a processing liquid. Specifically, in the liquid processing tank 200, a rinsing process that uses DIW is executed for a plurality of wafers W for one lot.

The storage tank 201 is provided with a processing liquid supply unit 204 that supplies a processing liquid to the storage tank 201 and a drain mechanism 205 that discharges a processing liquid from the storage tank 201.

The processing liquid supply unit 204 includes a plurality of (herein, two) discharge units 210, a DIW supply system 220 that supplies DIW to the plurality of discharge units 210, and an IPA supply system 230 that supplies IPA (isopropyl alcohol) to the plurality of discharge units 210. The plurality of discharge units 210 are arranged on an inside bottom of the storage tank 201.

The DIW supply system 220 includes a supply route 221, a DIW supply source 222, a valve 223, and a flow rate regulator 224. The supply route 221 connects the plurality of discharge units 210 and the DIW supply source 222. The DIW supply source 222 supplies DIW at an ordinary temperature to the plurality of discharge units 210. The valve 223 is provided on the supply route 221 and opens or closes the supply route 221. The flow rate regulator 224 is provided on the supply route 221 and regulates a flow rate of DIW that flows through the supply route 221.

The IPA supply system 230 includes a supply route 231, an IPA supply source 232, a valve 233, and a flow rate regulator 234. The supply route 231 connects the plurality of discharge units 210 and the IPA supply source 232 through, for example, the supply route 221. The IPA supply source 232 supplies IPA at an ordinary temperature to the plurality of discharge units 210. The valve 233 is provided on the supply route 231 and opens or closes the supply route 231. The flow rate regulator 234 is provided on the supply route 231 and regulates a flow rate of IPA that flows through the supply route 231.

The drain mechanism 205 includes a drain port 251, a drain route 252, and a valve 253. The drain port 251 is provided at a center of an inside bottom of the storage tank 201. The drain route 252 is connected to the drain port 251. The valve 253 is provided at a middle part of the drain route 252 and opens or closes the drain route 252.

The overflow tank 202 is formed on a peripheral part of the storage tank 201 at an upper end thereof and stores a processing liquid that overflows the storage tank 201. The seal tank 203 is formed on a peripheral part of the overflow tank 202 at an upper end thereof and stores a liquid such as, for example, water. A seal wall 333 as described later is dipped in a liquid that is stored in the seal tank 203, so that it is possible to disconnect an inside and an outside of the liquid processing tank 200.

(For Drying Process Tank 300)

The drying process tank 300 is arranged on an upper part of the liquid processing tank 200 and has an internal space that is communicated with the storage tank 201. The drying process tank 300 includes a body unit 301, a lid unit 302, and a shielding unit 303. The body part 301 is opened at an upper part and a lower part thereof. The body unit 301 is provided with a plurality of (herein, two) exhaust ports 311. The plurality of exhaust ports 311 are connected to an exhaust route 312 and an atmosphere in the drying process tank 300 is discharged to an outside thereof through the exhaust port 311 and the exhaust route 312.

The lid unit 302 is arranged above the body unit 301 and closes an opening of the body unit 301 at an upper part thereof. The lid unit 302 is configured to be capable of being lifted or lowered by a non-illustrated movement mechanism, and lifts the lid unit 302, so that it is possible to carry a plurality of wafers W in the drying process tank 300 or carry them out of the drying process tank 300.

The shielding unit 303 is arranged between the body unit 301 and the liquid processing tank 200. The shielding unit 303 includes a shielding door 331 and a housing 332. The shielding door 331 is configured to be capable of being moved by a non-illustrated movement mechanism in an inside of the housing 332 in a horizontal direction (herein, a direction of an X-axis), and closes or opens an opening of the body unit 301 at a lower part thereof.

The housing 332 is interposed between the liquid processing tank 200 and the body unit 301 and contains the shielding door 331 in an inside thereof. An opening that is communicated with an opening of the body unit 301 at a lower part thereof is formed on an upper part of the housing 332 and an opening that is communicated with an upper region of the storage tank 201 is formed on a lower part of the housing 332.

A seal wall 333 that protrudes downward is provided on a lower part of the housing 332. The seal wall 333 is dipped in a liquid that is stored in the seal tank 203. Thereby, it is possible to disconnect an inside and an outside of the liquid processing tank 200.

(For Gas Supply Unit 400)

The gas supply unit 400 includes a plurality of (herein, two) discharge units 410 that are arranged in an inside of the drying process tank 300, a supply route 415, and a heating unit 420 that is connected to the discharge units 410 through the supply route 415. Furthermore, the gas supply unit 400 includes a hydrophobizing liquid supply system 430 for supplying a hydrophobizing agent in a liquid state thereof (that will also be called a "hydrophobizing liquid" below) thereto, an IPA supply system 440 for supplying IPA thereto, and an $N_2$ supply system 450 for supplying $N_2$ gas thereto. The hydrophobizing liquid supply system 430, the IPA supply system 440, and the $N_2$ supply system 450 are connected to the heating unit 420.

The hydrophobizing liquid supply system 430 includes a hydrophobizing liquid supply source 431, a supply route 432, and a valve 433. The hydrophobizing liquid supply source 431 supplies a hydrophobizing liquid thereto. The supply route 432 connects the heating unit 420 and the hydrophobizing liquid supply source 431. The valve 433 is provided on the supply route 432 and opens or closes the supply route 432.

For a hydrophobizing liquid, it is possible to use, for example, a hydrophobizing agent of a silylating agent or a silane coupling agent. Specifically, it is possible to use trimethoxyphenylsilane, tetraethoxysilane, 3-glycidoxypropyltrimethoxysilane, or the like as a hydrophobizing agent. Furthermore, it is possible to use TMSDMA (trimethylsilyldimethylamine), DMADMA (dimethylsilyldimethylamine), TMSDEA (trimethylsilyldiethylamine), HMDS (hexamethyldisilazane), TMDS (1,1,3,3-tetramethyldisilazane), or the like as a hydrophobizing agent.

A surface of a wafer W is hydrophobized, so that it is possible to cause a contact angle between a processing liquid that remains on the wafer W and a pattern to approach 90°. Thereby, surface tension that acts on a pattern is reduced, so that collapse of the pattern is not readily caused.

The IPA supply system 440 includes an IPA supply source 441, a supply route 442, and a valve 443. The IPA supply source 441 supplies IPA in a liquid state thereof thereto. The supply route 442 connects the heating unit 420 and the IPA supply source 441. The valve 443 is provided on the supply route 442 and opens or closes the supply route 442.

The $N_2$ supply system 450 includes an $N_2$ supply source 451, a supply route 452, and a valve 453. The $N_2$ supply source 451 supplies an $N_2$ gas that is an inert gas thereto. The supply route 452 connects the heating unit 420 and the $N_2$ supply source 451. The valve 453 is provided on the supply route 452 and opens or closes the supply route 452.

As the valve 433 and the valve 453 are opened, the heating unit 420 is supplied with a hydrophobizing liquid and an $N_2$ gas. In such a case, the heating unit 420 heats a mixed fluid of a hydrophobizing agent and an $N_2$ gas, so as to produce a vapor of a hydrophobizing agent (that will also be called a "hydrophobizing gas" below). A produced hydrophobizing gas is supplied to the discharge units 410 through the supply route 415 and is discharged from the discharge units 410 to an inside of the drying process tank 300. The drying process tank 300 is sealed, so that a hydrophobizing gas that is discharged from the discharge units 410 fills an inside of the drying process tank 300.

On the other hand, as the supply route 442 and the valve 453 are opened, the heating unit 420 is supplied with IPA and an $N_2$ gas. In such a case, the heating unit 420 heats a mixed fluid of IPA and an $N_2$ gas, so as to produce a vapor of IPA (that will also be called an "IPA gas" below). A produced IPA gas is supplied to the discharge units 410 through the supply route 415 and is discharged from the discharge units 410 to an inside of the drying process tank 300. Similarly to a hydrophobizing gas, an IPA gas also fills an inside of the drying process tank 300.

(For Substrate Lifting/Lowering Mechanism 92)

The substrate lifting/lowering mechanism 92 includes a holding body 921, a shaft 922 that supports the holding body 921 thereon, and a movement mechanism 923 that lifts or lowers the shaft 922. The holding body 921 holds a plurality of wafers W for one lot in a state where they are provided side by side at a constant interval(s) in a perpendicular attitude thereof and in a horizontal direction (herein, a direction of a Y-axis). The shaft 922 extends along a vertical direction and supports the holding body 921 on a lower part thereof. The shaft 922 is slidably inserted through a non-illustrated opening that is provided on an upper part of the lid unit 302.

The movement mechanism 923 includes, for example, a motor, a ball screw, a cylinder, and the like, and moves the shaft 922 along a vertical direction. The movement mechanism 923 lifts or lowers the shaft 922, so that the holding body 921 that is supported by the shaft 922 is lifted or lowered. Thereby, it is possible to move a plurality of wafers W that are held by the holding body 921 between the storage tank 201 and the drying process tank 300.

<Specific Operation of Substrate Processing Apparatus>

Figure 4:
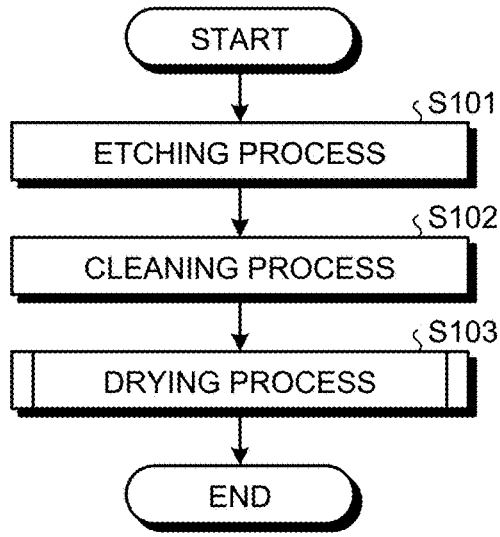
FIG. 4 is a flowchart that illustrates an example of a procedure of a process that is executed by a substrate processing apparatus according to a first embodiment.
Figure 5:
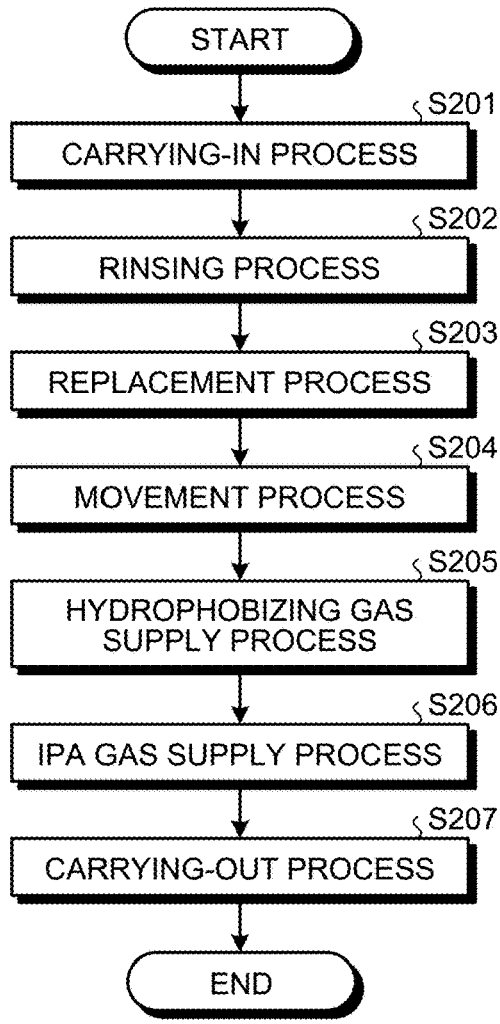
FIG. 5 is a flowchart that illustrates an example of a procedure of a drying process.
Figure 8:
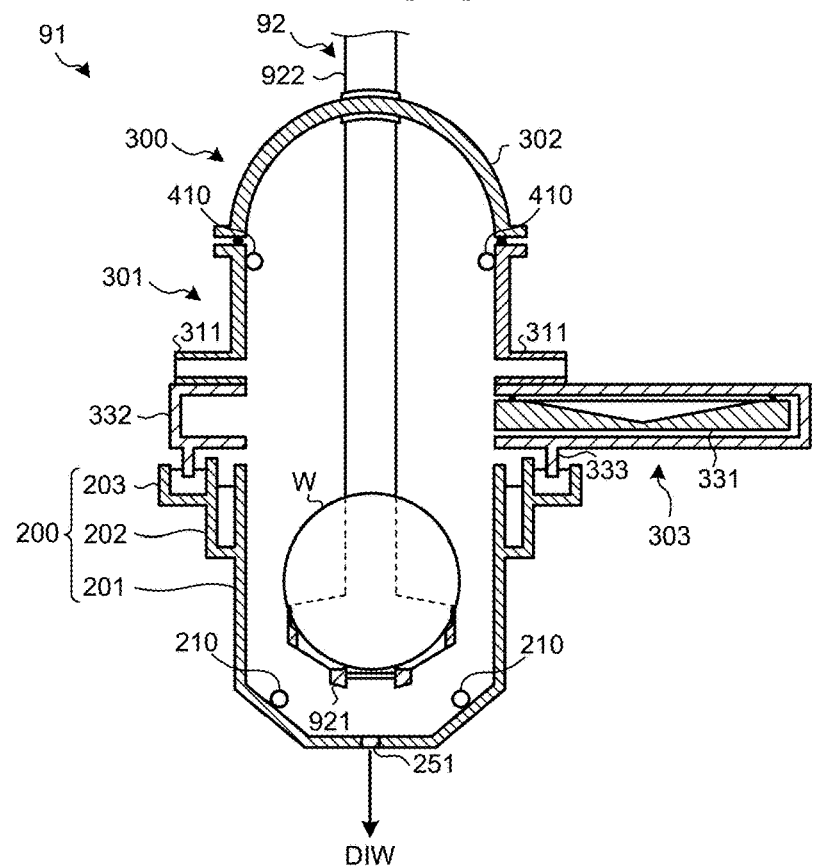
FIG. 8 is a diagram that illustrates an example of an operation of a replacement process.
Figure 9:
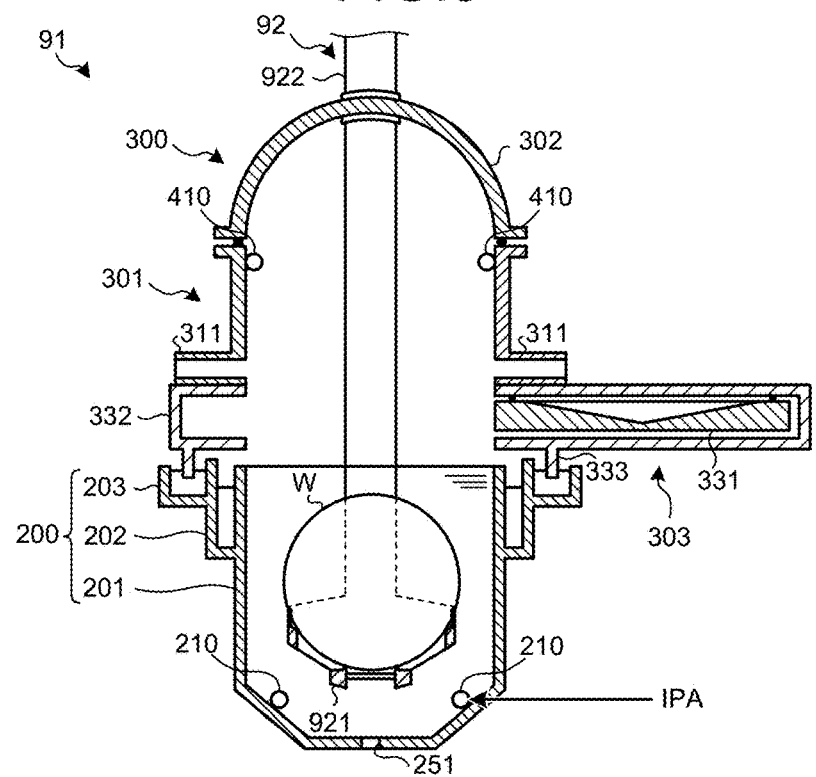
FIG. 9 is a diagram that illustrates an example of an operation of a replacement process.
Figure 10:
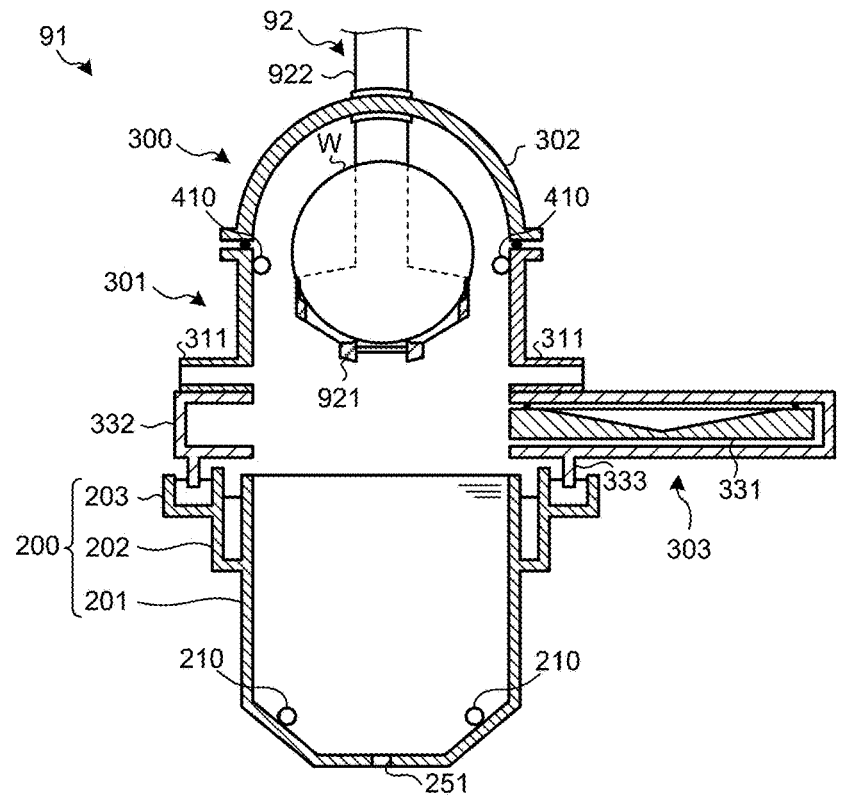
FIG. 10 is a diagram that illustrates an example of an operation of a movement process.
Figure 11:
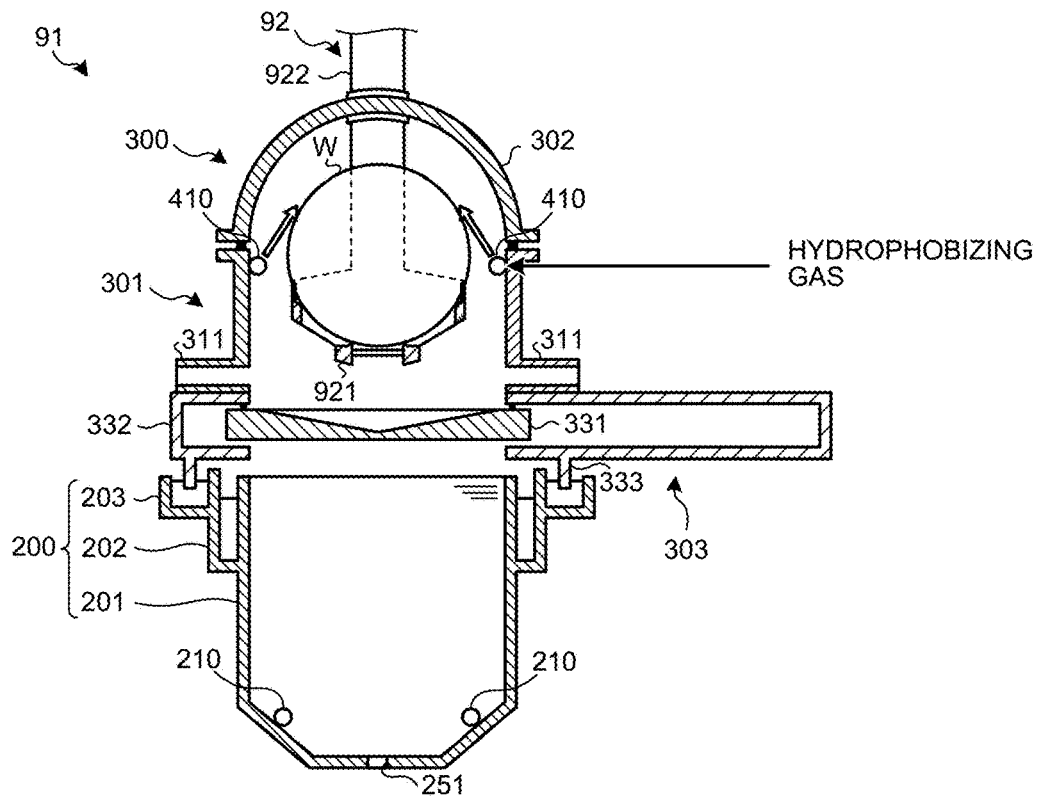
FIG. 11 is a diagram that illustrates an example of an operation of a hydrophobizing gas supply process.
Figure 12:
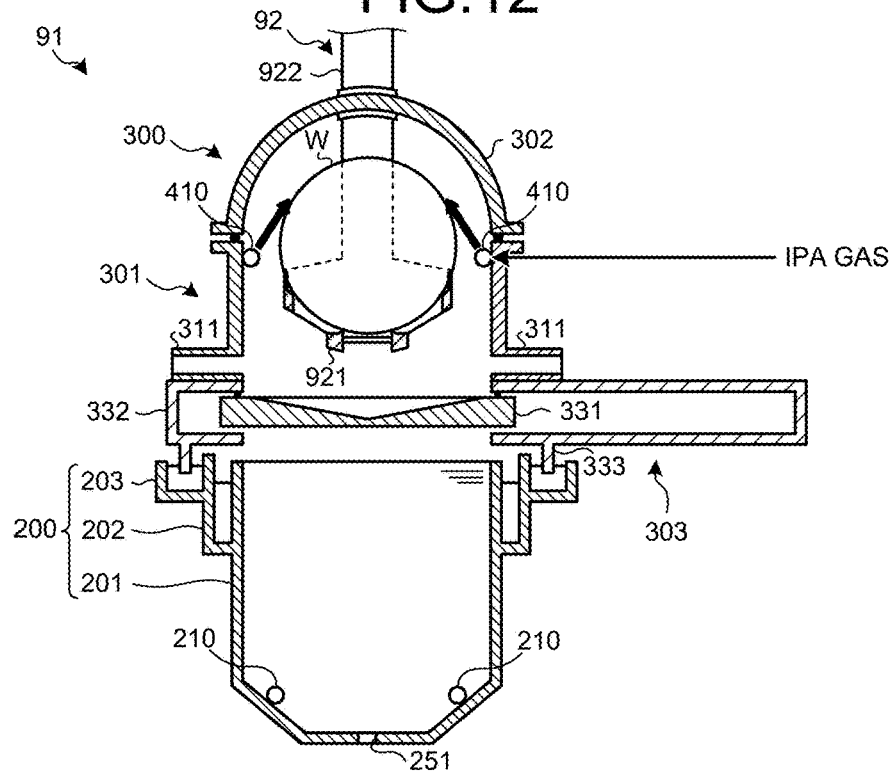
FIG. 12 is a diagram that illustrates an example of an operation of an IPA gas supply process.
Figure 13:
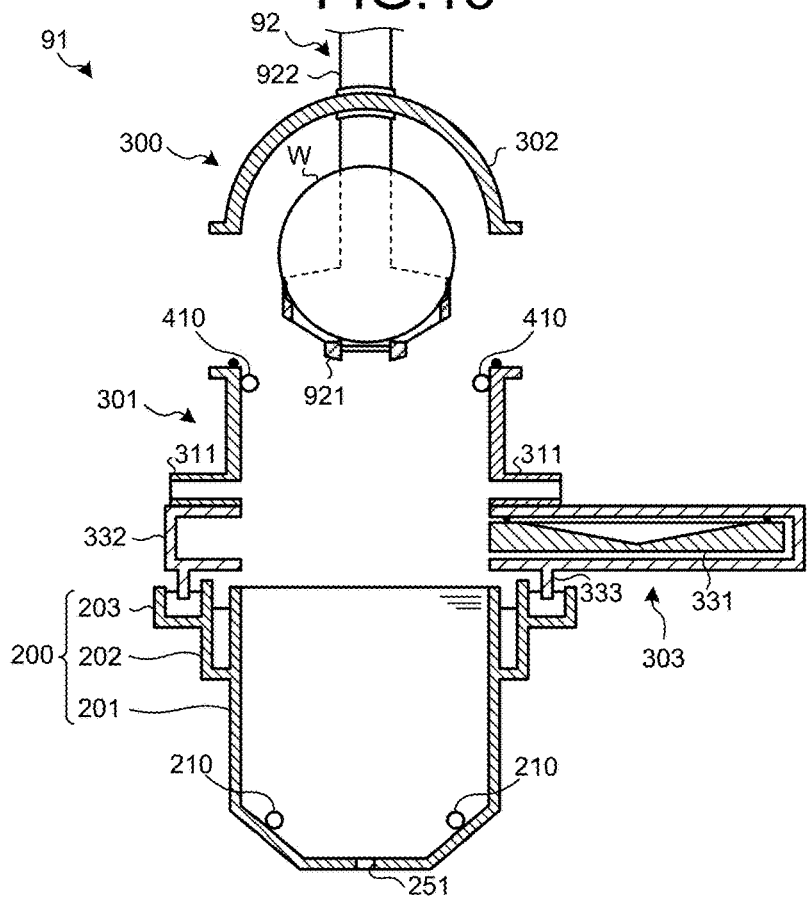
FIG. 13 is a diagram that illustrates an example of an operation of a carrying-out process.

Next, a specific operation of a substrate processing apparatus 1 according to a first embodiment will be explained with reference to FIG. 4 to FIG. 13. FIG. 4 is a flowchart that illustrates an example of a procedure of a process that is executed by the substrate processing apparatus 1 according to a first embodiment. FIG. 5 is a flowchart that illustrates an example of a procedure of a drying process. Furthermore, FIG. 6 is a diagram that illustrates an example of an operation of a carrying-in process, FIG. 7 is a diagram that illustrates an example of an operation of a rinsing process, and FIG. 8 and FIG. 9 are diagrams that illustrate an example of an operation of a replacement process. Furthermore, FIG. 10 is a diagram that illustrates an example of an operation of a movement process, FIG. 11 is a diagram that illustrates an example of an operation of a hydrophobizing gas supply process, FIG. 12 is a diagram that illustrates an example of an operation of an IPA gas supply process, and FIG. 13 is a diagram that illustrates an example of an operation of a carrying-out process.

As illustrated in FIG. 4, in the substrate processing apparatus 1, first, an etching process is executed in an etching process device 60 (step S101). Specifically, a substrate holding body 53 of a lot transfer mechanism 50 receives a lot that is formed by a lot transfer pedestal 40 and a moving body 52 of the lot transfer mechanism 50 transfers a received lot to a front of a processing tank 61 of the etching process device 60. Subsequently, a substrate lifting/lowering mechanism 63 receives a transferred lot and dips a received lot in an etching liquid that is stored in the processing tank 61.

Subsequently, the substrate holding body 53 receives a lot and the moving body 52 transfers a received lot to a front of a processing tank 62. Then, a substrate lifting/lowering mechanism 64 receives a transferred lot and dips a received lot in a rinsing liquid (DIW) that is stored in the processing tank 62.

Then, in the substrate processing apparatus 1, a cleaning process is executed in a cleaning process device 70 (step S102). Specifically, the substrate holding body 53 of the lot transfer mechanism 50 receives a lot after an etching process and the moving body 52 of the lot transfer mechanism 50 transfers a received lot to a front of a processing tank 71 of the cleaning process device 70. Subsequently, a substrate lifting/lowering mechanism 73 receives a transferred lot and dips a received lot in a cleaning liquid that is stored in the processing tank 71.

Subsequently, the substrate holding body 53 receives a lot and the moving body 52 transfers a received lot to a front of a processing tank 72. Then, a substrate lifting/lowering mechanism 74 receives a transferred lot and dips a received lot in a rinsing liquid (DIW) that is stored in the processing tank 72.

Then, in the substrate processing apparatus 1, a drying process is executed in a drying process device 90 (step S103).

First, in the drying process device 90, a carrying-in process that carries a lot in a storage tank 201 is executed (step S201). Specifically, a holding body 921 of a substrate lifting/lowering mechanism 92 receives a lot from the substrate holding body 53 of the lot transfer mechanism 50 (see FIG. 6). Subsequently, the drying process device 90 lowers a lid unit 302 by using a non-illustrated movement mechanism and lowers a shaft 922 by using a movement mechanism 923. Thereby, an opening of a body unit 301 of a drying process tank 300 at an upper part thereof is closed by the lid unit 302, so that the drying process tank 300 is provided in a sealed state thereof.

Then, in the drying process device 90, a rinsing process is executed (step S202). Specifically, the drying process device 90 lowers the shaft 922 by using the movement mechanism 923, so that a lot is dipped in DIW that is stored in the storage tank 201 (see FIG. 7). Thereby, a plurality of wafers W for one lot are rinsing-processed by DIW.

Then, in the drying process device 90, a replacement process is executed (step S203). Specifically, the drying process device 90 opens a valve 253 (see FIG. 3) of a drain mechanism 205, so that DIW that is stored in the storage tank 201 is discharged from a drain port 251 (see FIG. 8).

Subsequently, the drying process device 90 opens a valve 233 of an IPA supply system 230, so that IPA is discharged from discharge units 210 and the IPA is stored in the storage tank 201. Thereby, a lot that is arranged in the storage tank 201 is dipped in IPA. Then, DIW that is attached to a plurality of wafers W in a rinsing process is replaced with IPA (see FIG. 9).

Thus, in the substrate processing apparatus 1 according to a first embodiment, DIW that is attached to a plurality of wafers W is replaced with IPA prior to a hydrophobizing gas supply process.

The inventor(s) of the present application executed an experiment where rates of collapse of a pattern that was formed on a surface of a wafer W were compared between a case where a hydrophobizing gas (a gas of TMDMA) was supplied to a wafer where DIW was attached thereto and a case where DIW on a wafer W was replaced with IPA and a similar hydrophobizing gas was supplied thereto. As a result, whereas a rate of collapse of a pattern for a former was 34.2%, a rate of collapse of a pattern for a latter was 0.5%. As is clear from such a result, a replacement process is executed where DIW that is attached to a wafer W is replaced with IPA, so that it is possible to prevent or reduce collapse of a pattern preferably as compared with a case where a replacement process is not executed. Additionally, it is considered that one of reasons why a rate of collapse of a pattern is reduced by replacement with IPA is because deactivating of a hydrophobizing gas by contact with water and thereby insufficiently attaining of hydrophobizing of a wafer W is prevented or reduced by replacement with IPA.

Herein, an example of a case where, after a rinsing process with DIW is executed, a replacement process is executed while DIW in the storage tank 201 is discharged and IPA is stored in the storage tank 201 has been explained. This is not limiting and the drying process device 90 may store IPA in the storage tank 201, for example, in a state where DIW is stored in the storage tank 201 or while DIW is discharged from the storage tank 201. That is, a rinsing process with DIW and a replacement process with IPA may be executed so as to overlap partially. Furthermore, the drying process device 90 may preliminarily store a mixed liquid of IPA and DIW in the storage tank 201 and dip a lot in such a mixed liquid. It is sufficient that the drying process device 90 dips a lot in a processing liquid where, at least, a concentration of IPA is 90% or greater.

Furthermore, the substrate processing apparatus 1 does not have to execute a rinsing process in a liquid processing tank 200 of the drying process device 90. That is, the drying process device 90 may preliminarily store IPA in the storage tank 201 and dip a lot in such IPA, so as to execute a replacement process without executing a rinsing process. Additionally, in such a case, DIW that is attached to a wafer W is replaced with IPA in a cleaning process in the cleaning process device 70.

Furthermore, although a replacement process is executed by using IPA herein, a replacement process may be executed by using an organic solvent other than IPA. Specifically, for an organic solvent that is used for a replacement process, it is preferable to use an organic solvent with an amphipathic property that has a hydrophilic group and a hydrophobic group. For such an organic solvent, for example, ethanol, acetone, and/or the like, other than IPA, is/are provided.

As a replacement process at step S203 is ended, a movement process is executed in the drying process device 90 (step S204). Specifically, the substrate lifting/lowering mechanism 92 lifts the shaft 922 by using the movement mechanism 923, so as to lift a lot that is held by the holding body 921 from the storage tank 201 (see FIG. 10). Thereby, a lot is arranged in the drying process tank 300.

Then, in the drying process device 90, a hydrophobizing gas supply process is executed (step S205). Specifically, first, the drying process device 90 moves a shielding door 331 to a position where an opening of the body unit 301 of the drying process tank 300 on a lower part thereof is closed. Thereby, a state is provided where the drying process tank 300 is sealed by the lid unit 302 and the shielding door 331 (see FIG. 11). Subsequently, the drying process device 90 discharges a heated hydrophobizing gas (vapor) from discharge units 410.

A hydrophobizing gas fills an inside of the drying process tank 300 and contacts a wafer W at an ordinary temperature, so as to cause dew condensation on a surface of the wafer W and be attached to the wafer W. Thereby, IPA that remains on a wafer W is replaced with a hydrophobizing agent (liquid), so that a surface of the wafer W is hydrophobized. A surface of a wafer W is hydrophobized, so that collapse of a pattern that is formed on the surface of the wafer W is prevented or reduced.

Then, in the drying process device 90, an IPA gas supply process is executed (step S206). Specifically, the drying process device 90 stops discharge of a hydrophobizing gas from the discharge units 410 and discharges a heated IPA gas (vapor) from the discharge units 410 (see FIG. 12). Thereby, a hydrophobizing agent (liquid) that remains on a wafer W is replaced with IPA and the IPA volatilizes, so that the wafer W is dried.

Thus, a hydrophobizing agent that remains on a wafer W is replaced with IPA with a less surface free energy, so that it is possible to further prevent or reduce collapse of a pattern. Furthermore, a hydrophobizing agent that remains on a wafer W is replaced with IPA, so that it is possible for IPA to wash away an impurity/impurities that originate(s) from a hydrophobizing agent from a surface of the wafer W and hence it is possible to reduce an amount of a particle(s) that remain(s) on the wafer W after a drying process.

Additionally, the drying process device 90 does not have to execute an IPA gas supply process. In such a case, the drying process device 90 may discharge an $N_2$ gas from the discharge units 410 instead of an IPA gas supply process, so as to dry a wafer W. It is preferable for the heating unit 420 to heat an $N_2$ gas.

Then, in the drying process device 90, a carrying-out process is executed (step S207). Specifically, the drying process device 90 lifts the lid unit 302 and the substrate lifting/lowering mechanism 92 (see FIG. 13). Then, the drying process device 90 passes a lot after a drying process to the substrate holding body 53 of the lot transfer mechanism 50.

Second Embodiment

Figure 14:
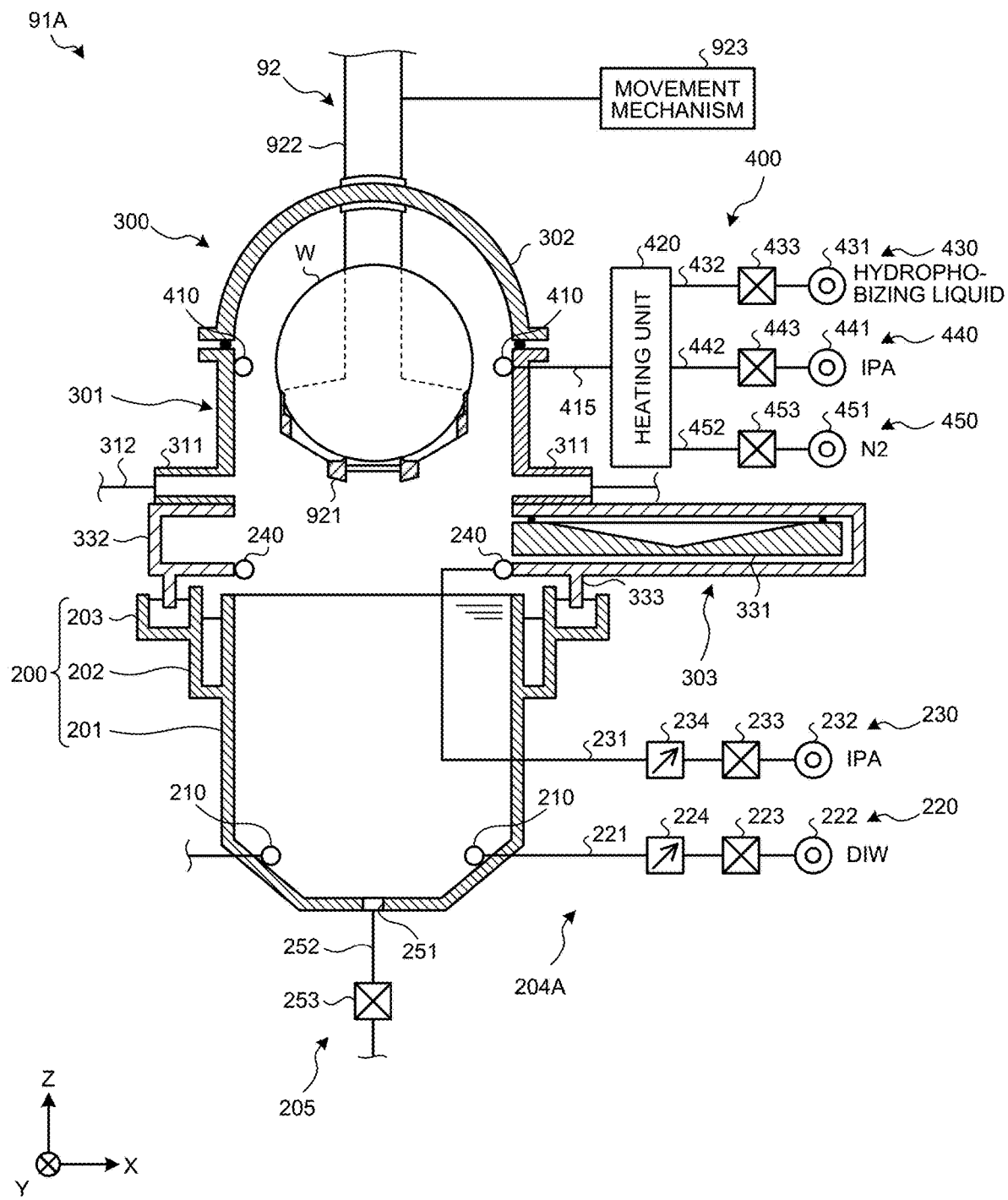
FIG. 14 is a schematic cross-sectional view of a processing tank for a drying process according to a second embodiment.
Figure 15:
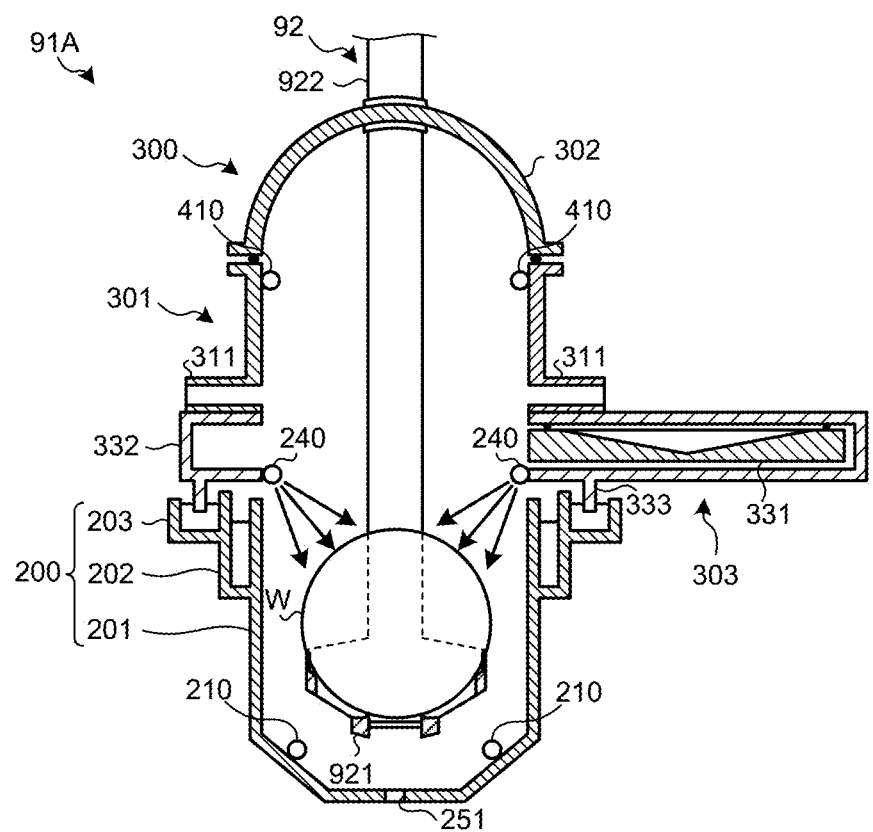
FIG. 15 is a diagram that illustrates an example of an operation of a replacement process according to a second embodiment.

Next, a drying process device according to a second embodiment will be explained with reference to FIG. 14. FIG. 14 is a schematic cross-sectional view of a processing tank for a drying process according to a second embodiment. Furthermore, FIG. 15 is a diagram that illustrates an example of an operation of a replacement process according to a second embodiment.

As illustrated in FIG. 14, a processing tank 91A according to a second embodiment includes a processing liquid supply unit 204A. The processing liquid supply unit 204A includes a plurality of discharge units 240 other than a plurality of discharge units 210 as described above. Whereas the plurality of discharge units 210 are arranged in an inside of a storage tank 201, the plurality of discharge units 240 are arranged above the storage tank 201. The plurality of discharge units 210 are connected to a DIW supply system 220 and the plurality of discharge units 240 are connected to an IPA supply system 230.

Thus, the processing tank 91A according to a second embodiment is configured in such a manner that DIW is discharged from the plurality of discharge units 210 that are arranged in an inside of the storage tank 201 and IPA is discharged from the plurality of discharge units 240 that are arranged above the storage unit 201.

For the plurality of discharge units 240, for example, a nozzle tip for a spray is used. The plurality of discharge units 240 discharge (spray) IPA toward an inside of the storage tank 201 like a shower.

Additionally, it is sufficient that, at least, the plurality of discharge units 240 are arranged above the plurality of discharge units 210, and they do not have to be arranged in an outside of the storage unit 201.

As illustrated in FIG. 15, a drying process device 90 according to a second embodiment discharge IPA like a shower from the plurality of discharge units 240 to a plurality of wafers W that are arranged in the storage tank 201, in a replacement process where DIW that is attached to the wafers W is replaced with IPA.

Thus, IPA is not stored in the storage tank 201 but is supplied to wafers W by spraying thereof, so that it is possible to prevent or reduce an amount of consumption of IPA in a replacement process.

Third Embodiment

Although an example of a case where hydrophobizing of a wafer W is executed at a time of a drying process that is executed in a drying process device 90 has been explained in a first or second embodiment as described above, a timing of hydrophobizing of a wafer W is not limited to a time of a drying process.

Figure 16:
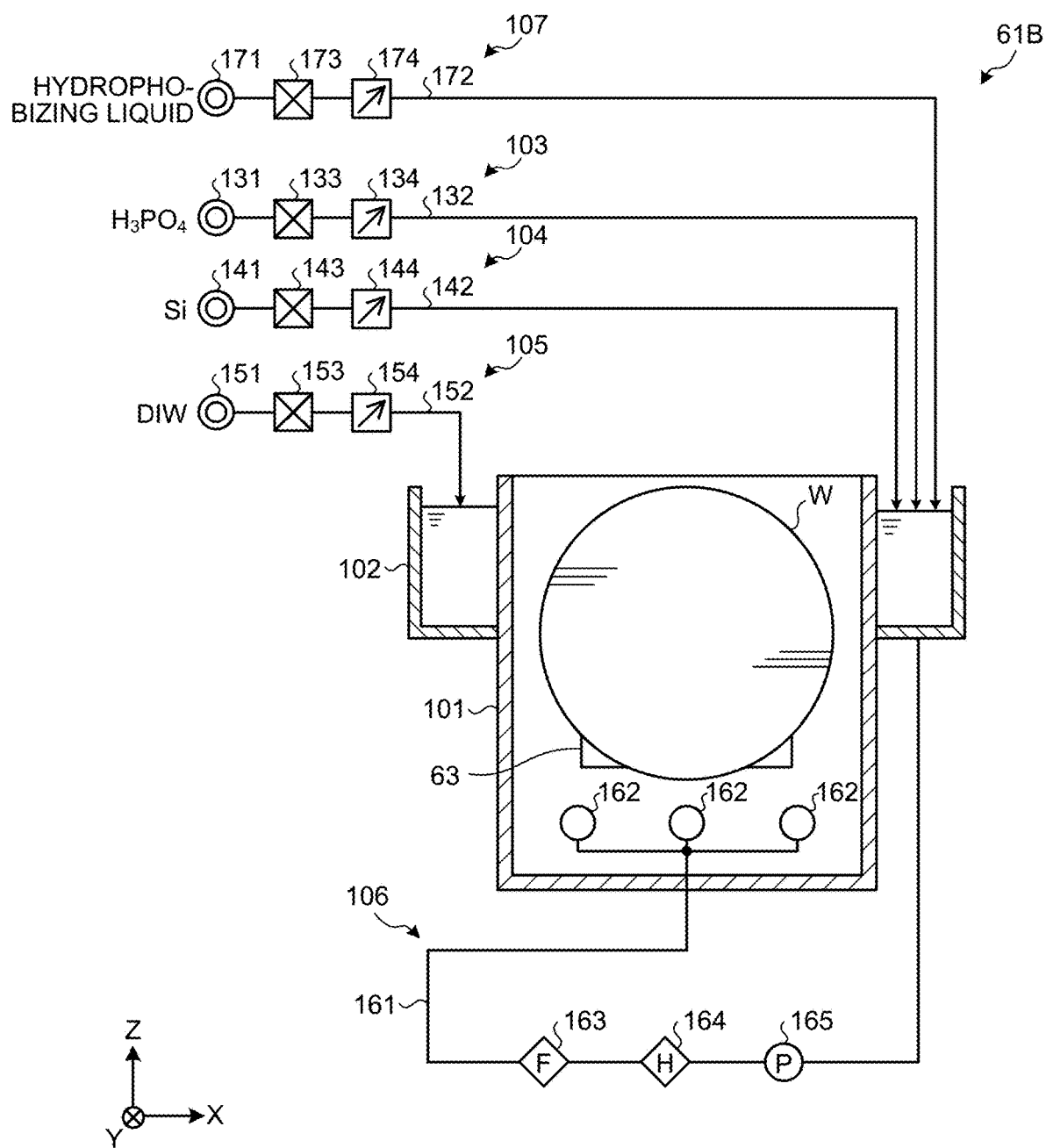
FIG. 16 is a schematic cross-sectional view of a processing tank for an etching process according to a third embodiment.

For example, a substrate processing apparatus 1 may execute hydrophobizing of a wafer W at a time of an etching process that is executed in an etching process device 60. FIG. 16 is a schematic cross-sectional view of a processing tank for an etching process according to a third embodiment.

As illustrated in FIG. 16, a processing tank 61B according to a third embodiment includes a hydrophobizing liquid supply system 107. The hydrophobizing liquid supply system 107 has a hydrophobizing liquid supply source 171, a supply route 172, a valve 173, and a flow rate regulator 174. The hydrophobizing liquid supply source 171 supplies a hydrophobizing liquid thereto. The supply route 172 connects the hydrophobizing liquid supply source 171 and an outer tank 102 and supplies a hydrophobizing liquid from the hydrophobizing liquid supply source 171 to the outer tank 102. The valve 173 is provided on the supply route 172 and opens or closes the supply route 172. The flow rate regulator 174 is provided on the supply route 172 and regulates a flow rate of a hydrophobizing liquid that is supplied to the outer tank 102.

Thus, in a substrate processing apparatus according to a third embodiment, the processing tank 61B is provided with the hydrophobizing liquid supply system 107, so that, for example, it is possible to execute a hydrophobizing process for a plurality of wafers W in parallel in an etching process for the plurality of wafers W.

For example, the processing tank 61B may store an etching liquid that is mixed with a hydrophobizing liquid in an inner tank 101. That is, the processing tank 61B may start a hydrophobizing process at a time of a start of an etching process by using an etching liquid that is mixed with a hydrophobizing liquid. Furthermore, the proceeding tank 61B may start supply of a hydrophobizing liquid from the hydrophobizing liquid supply system 107 to the inner tank 101 after starting an etching process while storing an etching liquid in the inner tank 101. In such a case, a concentration of a hydrophobizing liquid in the inner tank 101 is gradually increased, so that it is possible to shift from an etching process to a hydrophobizing process gradually.

Thus, a hydrophobizing process may be executed in the processing tank 61B for an etching process. Thereby, for example, it is possible to prevent or reduce not only collapse of a pattern after a drying process in a drying process device 90 but also collapse of a pattern at a time of transfer from the etching process device 60 to a cleaning process device 70 and/or at a time of transfer from the cleaning process device 70 to the drying process device 90.

Furthermore, a hydrophobizing process may be executed in a processing tank 71 for a cleaning process that has a configuration that is similar to that of a processing tank 61 for an etching process as described above. The processing tank 71 for a cleaning process includes a cleaning chemical liquid supply unit, instead of a phosphoric acid aqueous solution supply system 103, a silicon supply system 104, and a DIW supply system 105. A cleaning chemical liquid supply unit has a cleaning chemical liquid supply source, a supply route, a valve, and a flow rate regulator. A cleaning chemical liquid supply source supplies, for example, SC1 as a cleaning chemical liquid thereto. A supply route connects a cleaning chemical liquid supply source and an outer tank and supplies an aqueous solution of phosphoric acid from a cleaning chemical liquid supply source to an outer tank. A valve is provided on a supply route and opens or closes the supply route. A flow rate regulator is provided on a supply route and regulates a flow rate of a cleaning chemical liquid that is supplied to an outer tank.

The hydrophobizing liquid supply system 107 as described above is provided for such a processing tank 71, so that it is possible to execute a hydrophobizing process in parallel to a cleaning process.

Fourth Embodiment

Figure 17:
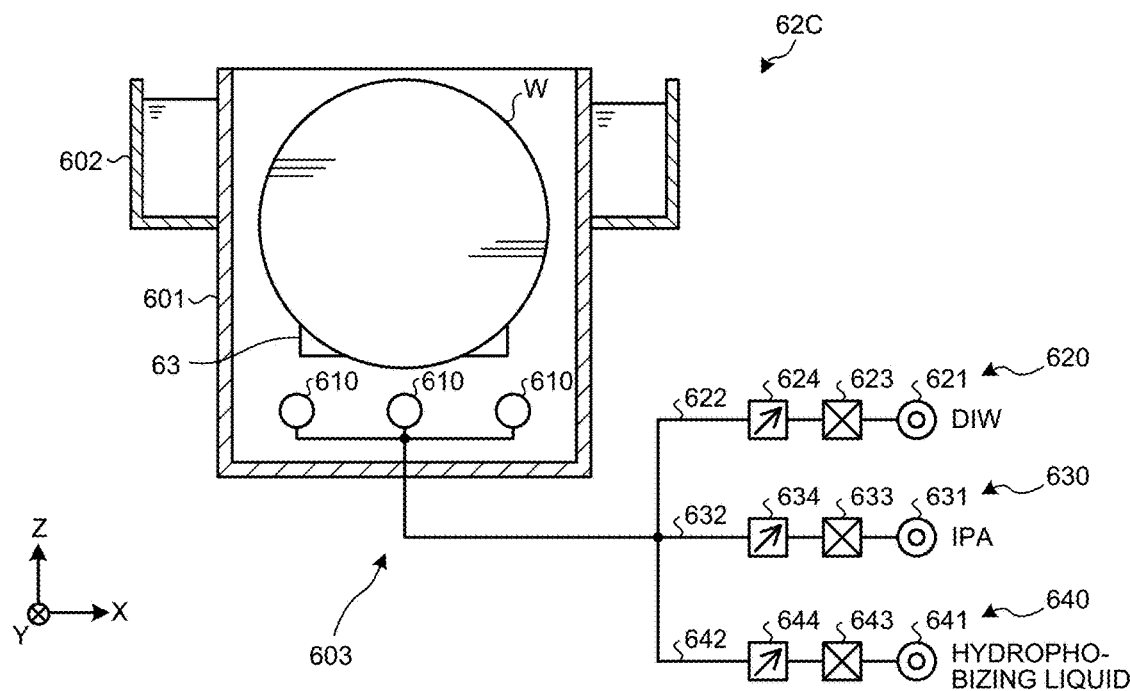
FIG. 17 is a schematic cross-sectional view of a processing tank for a rinsing process according to a fourth embodiment.

A substrate processing apparatus 1 may execute a hydrophobizing process in a processing tank for a rinsing process that is included in an etching process device or a cleaning process device. Such a point will be explained by providing, as an example, a processing tank for a rising process that is included in an etching process device. FIG. 17 is a schematic cross-sectional view of a processing tank for a rinsing process according to a fourth embodiment.

As illustrated in FIG. 17, a processing tank 62C for a rising process according to a fourth embodiment includes an inner tank 601 and an outer tank 602. Furthermore, the processing tank 62C includes a processing liquid supply unit 603.

The processing liquid supply unit 603 includes a plurality of discharge units 610, a DIW supply system 620, an IPA supply system 630, and a hydrophobizing liquid supply system 640.

The DIW supply system 620 includes a DIW supply source 621, a supply route 622, a valve 623, and a flow rate regulator 624. The DIW supply source 621 supplies DIW thereto. The supply route 622 connects the DIW supply source 621 and the plurality of discharge units 610 and supplies DIW from the DIW supply source 621 to the plurality of discharge units 610. The valve 623 is provided on the supply route 622 and opens or closes the supply route 622. The flow rate regulator 624 is provided on the supply route 622 and regulates a flow rate of DIW that flows through the supply route 622.

The IPA supply system 630 includes an IPA supply source 631, a supply route 632, a valve 633, and a flow rate regulator 634. The IPA supply source 631 supplies IPA thereto. The supply route 632 connects the IPA supply source 631 and the plurality of discharge units 610 and supplies IPA from the IPA supply source 631 to the plurality of discharge units 610. The valve 633 is provided on the supply route 632 and opens or closes the supply route 632. The flow rate regulator 634 is provided on the supply route 632 and regulates a flow rate of IPA that flows through the supply route 632.

The hydrophobizing liquid supply system 640 includes a hydrophobizing liquid supply source 641, a supply route 642, a valve 643, and a flow rate regulator 644. The hydrophobizing liquid supply source 641 supplies a hydrophobizing liquid thereto. The supply route 642 connects the hydrophobizing liquid supply source 641 and the plurality of discharge units 610 and supplies a hydrophobizing liquid from the hydrophobizing liquid supply source 641 to the plurality of discharge units 610. The valve 643 is provided on the supply route 642 and opens or closes the supply route 642. The flow rate regulator 644 is provided on the supply route 642 and regulates a flow rate of a hydrophobizing liquid that flows through the supply route 642.

In such a processing tank 62C, for example, a mixed liquid of DIW, IPA, and a hydrophobizing liquid is stored in the inner tank 601. In such a case, a plurality of wafers W are dipped in such a mixed liquid, so that it is possible to execute a rinsing process and a hydrophobizing process in parallel. Herein, a reason why not only DIW and a hydrophobizing liquid but also IPA is contained therein is because the hydrophobizing liquid is not readily dissolved in the DIW. That is, IPA that has an affinity for both a hydrophobizing liquid and DIW is added thereto, so that it is possible to accelerate dissolving of the hydrophobizing liquid in the DIW.

In the processing tank 62C, a rinsing process for a plurality of wafers W may be executed again by using DIW after executing a rinsing process and a hydrophobizing process for the plurality of wafers W by using a mixed liquid of DIW, IPA, and a hydrophobizing liquid. In such a case, for example, it is sufficient that a mixed liquid is discharged from a non-illustrated drain port of the processing tank 62C and subsequently DIW that is supplied from the DIW supply system 620 is stored in the inner tank 601 so as to dip a plurality of wafers W in the DIW.

Figure 18:
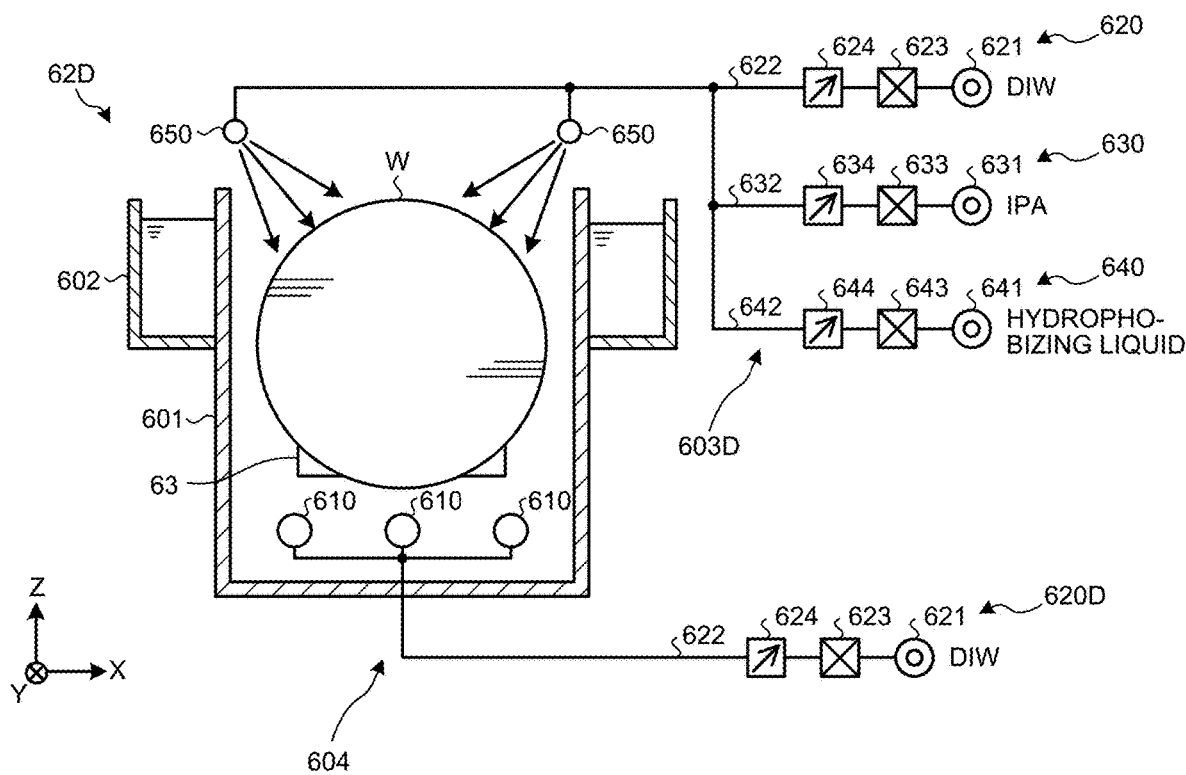
FIG. 18 is a schematic cross-sectional view of a processing tank for a rinsing process according to a variation of a fourth embodiment.

FIG. 18 is a schematic cross-sectional view of a processing tank for a rising process according to a variation of a fourth embodiment. As illustrated in FIG. 18, a processing tank 62D according to a variation includes processing liquid supply units 603D, 604.

A processing liquid supply unit 604 includes a plurality of discharge units 610 that are arranged on an inside bottom of an inner tank 601 and a DIW supply system 620D where DIW that is supplied from the DIW supply system 620D is discharged from the plurality of discharge units 610, so that the DIW is stored in the inner tank 601. Additionally, a configuration of the DIW supply system 620D is similar to a configuration of a DIW supply system 620.

A processing liquid supply unit 603D includes a plurality of discharge units 650, the DIW supply system 620, an IPA supply system 630, and a hydrophobizing liquid supply system 640. The DIW supply system 620, the IPA supply system 630, and the hydrophobizing liquid supply system 640 are connected to the plurality of discharge units 650 and respectively supply DIW, IPA, and a hydrophobizing liquid to the plurality of discharge units 650. The plurality of discharge units 650 are arranged above the inner tank 601 and discharge a mixed liquid of DIW, IPA, and a hydrophobizing liquid toward an inside of the inner tank 601 like a shower.

In the processing tank 62D according to a variation, for example, a rinsing process is executed by using DIW that is stored in the inner tank 601 and subsequently the DIW is discharged from a non-illustrated drain port. Subsequently, in the processing tank 62D according to a variation, a mixed liquid of DIW, IPA, and a hydrophobizing liquid is discharged from the plurality of discharge units 650 like a shower, so that the hydrophobizing liquid is supplied to a plurality of wafers W after a rising process.

Thus, the processing tank 62D may discharge a mixed liquid of DIW, IPA, and a hydrophobizing liquid like a shower, so as to hydrophobize a plurality of wafers W.

Another/Other Embodiment(s)

Although an example of a case where a gas of a hydrophobizing agent is supplied to a plurality of wafers W in a drying process device 90 has been explained in a first and/or a second embodiment(s) as described above, the drying process device 90 may supply a liquid of a hydrophobizing agent to a plurality of wafers W. In such a case, for example, it is sufficient that a supply system that is similar to a hydrophobizing liquid supply system 430 is provided in a processing liquid supply unit 204 and a mixed liquid of DIW, IPA, and a hydrophobizing liquid is stored in a storage tank 201. Thereby, it is possible to execute a hydrophobizing process in parallel to a rinsing process.

In each embodiment as described above, an example of a case where a hydrophobizing process is executed in an etching process device 60, a cleaning process device 70, and a drying process device 90 has been explained. This is not limiting, and a substrate processing apparatus 1 may include a dedicated processing tank for executing a hydrophobizing process separately from the etching process device 60, the cleaning process device 70, and the drying process device 90.

As has been described above, a substrate processing apparatus according to an embodiment (a substrate processing apparatus 1 as an example thereof) includes a liquid processing tank (a processing tank(s) 61, 62, 71, 72, 91 as an example(s) thereof), and a hydrophobizing gas supply unit (a discharge unit(s) 410, an IPA supply system 440, and an $N_2$ supply system 450 as an example(s) thereof). The liquid processing tank stores a processing liquid (DIW, IPA, an etching liquid, a cleaning liquid, and/or the like as an example(s) thereof) and dips a plurality of substrates (wafers W as an example(s) thereof) in the processing liquid so as to liquid-process the plurality of substrates. The hydrophobizing gas supply unit supplies a gas of a hydrophobizing agent (a hydrophobizing gas as an example thereof) to the plurality of substrates after the liquid processing. Thereby, it is possible to prevent or reduce collapse of a pattern in a batch-type substrate processing apparatus that processes a plurality of substrates collectively.

The substrate processing apparatus according to an embodiment further may include a drying process tank (a drying process tank 300 as an example thereof), and a movement mechanism (a movement mechanism 923 as an example thereof). The drying process tank is arranged on an upper part of the liquid processing tank (a liquid processing tank 200 as an example thereof) and executes a drying process for the plurality of substrates. The movement mechanism lifts the plurality of substrates from the liquid processing tank and moves them to the drying process tank. In such a case, the hydrophobizing gas supply unit may supply the gas of a hydrophobizing agent to an inside of the drying process tank. An inside of a drying process tank is filled with a hydrophobizing gas, so that it is possible to attach a hydrophobizing agent to a substrate efficiently.

The substrate processing apparatus according to an embodiment may further include an organic solvent supply unit (the discharge unit(s) 410, a hydrophobizing liquid supply system 430, and the $N_2$ supply system 450 as an example(s) thereof) that supplies a vapor of an organic solvent (an IPA gas as an example thereof) to an inside of the drying process tank.

A hydrophobizing agent that remains on a substrate is replaced with an organic solvent with a less surface free energy, so that it is possible to further prevent or reduce collapse of a pattern. Furthermore, a hydrophobizing agent that remains on a substrate is replaced with an organic solvent, so that it is possible for an organic solvent to wash away an impurity/impurities that originate(s) from a hydrophobizing agent from a surface of the substrate and hence it is possible to reduce an amount of a particle(s) that remain(s) on the substrate after a drying process.

The substrate processing apparatus according to an embodiment may include a processing liquid supply unit (a processing liquid supply part 204 as an example thereof) that supplies the processing liquid to the liquid processing tank. In such a case, the processing liquid supply unit may include an organic solvent supply system (an IPA supply system 230 as an example thereof) that supplies an organic solvent (IPA as an example thereof) thereto. Water that is attached to a substrate is replaced with an organic solvent, so that it is possible to prevent or reduce collapse of a pattern preferably.

The processing liquid supply unit may further include a water supply system (a DIW supply system 220 as an example thereof) that supplies water (DIW as an example thereof) thereto. In such a case, the processing liquid supply unit may further include a discharge unit (a discharge unit(s) 210 as an example(s) thereof) that is arranged in an inside of the liquid processing tank and is connected to the organic solvent supply system and the water supply system. Thereby, for example, a mixed liquid of water and an organic solvent is stored in a liquid processing tank and a plurality of substrates are dipped in such a mixed liquid, so that it is possible to attach the organic solvent to the plurality of substrates.

Furthermore, it is possible to store water in a liquid processing tank and dip a plurality of substrates in the water, subsequently discharge the water from the liquid processing tank, and subsequently store an organic solvent in the liquid processing tank and dip the plurality of substrates in the organic solvent.

The processing liquid supply unit may include an organic solvent discharge unit (a discharge unit(s) 240 as an example(s) thereof), and a water discharge unit (the discharge unit(s) 210 as an example(s) thereof). The organic solvent discharge unit is connected to the organic solvent supply system and discharges the organic solvent to an inside of the liquid processing tank. The water discharge unit is connected to the water supply system and discharges the water to an inside of the liquid processing tank.

The organic solvent discharge unit may be arranged above the water discharge unit and discharge the organic solvent toward an inside of the liquid processing tank like a shower. An organic solvent is discharged like a shower and is supplied to a plurality of substrates, so that it is possible to maintain or reduce an amount of consumption of the organic solvent.

The substrate processing apparatus according to an embodiment may include a processing liquid supply unit (a phosphoric acid aqueous solution supply system 103, a silicon supply system 104, a DIW supply system 105, a circulation unit 106, and a hydrophobizing liquid supply system 107 as an example(s) thereof). The processing liquid supply unit supplies the processing liquid to the liquid processing tank (an inner tank 101 as an example thereof). In such a case, the processing liquid supply unit may include a chemical liquid supply system (the phosphoric acid aqueous solution supply system 103, the silicon supply system 104, and the DIW supply system 105 as an example(s) thereof) that supplies a chemical liquid (an etching liquid as an example thereof) that is used for a chemical liquid process for the plurality of substrates, and a hydrophobizing liquid supply system (the hydrophobizing liquid supply system 107 as an example thereof) that supplies a liquid of the hydrophobizing agent thereto. Hydrophobizing of a plurality of substrates is also executed in a processing tank where a chemical liquid process is executed, so that, for example, it is possible to prevent or reduce collapse of a pattern during transfer of a plurality of substrates from the processing tank where a chemical liquid process is executed to another processing tank.

The substrate processing apparatus according to an embodiment may include a processing liquid supply unit (a processing liquid supply unit(s) 603, 603D as an example(s) thereof). The processing liquid supply unit supplies the processing liquid to the liquid processing tank (a processing tank(s) 62, 62D as an example(s) thereof). In such a case, the processing liquid supply unit may include a water supply system (a DIW supply system(s) 620, 620D as an example(s) thereof) that supplies water that is used for a rinsing process for the plurality of substrates, and a hydrophobizing liquid supply system (a hydrophobizing liquid supply system 640 as an example thereof) that supplies a liquid of the hydrophobizing agent thereto. Hydrophobizing of a plurality of substrates is also executed in a processing tank where a rinsing process is executed, so that, for example, it is possible to prevent or reduce collapse of a pattern during transfer of a plurality of substrates from the processing tank where a rinsing process is executed to another processing tank.

The processing liquid supply unit may further include an organic solvent supply system (an IPA supply system 630 as an example thereof) that supplies an organic solvent (IPA as an example thereof) thereto. An organic solvent that has an affinity with both a hydrophobizing agent and water is added thereto, so that it is possible to accelerate dissolving of the hydrophobizing agent in the water.

It should be considered that an embodiment(s) as disclosed herein is/are not limitative but is/are illustrative in all aspects thereof. In fact, it is possible to implement an embodiment(s) as described above in a variety of forms. Furthermore, an embodiment(s) as described above may be omitted, substituted, or modified in a variety of forms without departing from the appended claim(s) and an essence thereof.

REFERENCE SIGNS LIST

W wafer
1 substrate processing apparatus
60 etching process device
70 cleaning process device
90 drying process device
61, 62, 71, 72, 91 processing tank
92 substrate lifting/lowering mechanism
200 liquid processing tank
204 processing liquid supply unit
300 drying process tank
400 gas supply unit
410 discharge unit
420 heating unit
430 hydrophobizing liquid supply system
440 IPA supply system
450 $N_2$ supply system

The invention claimed is:

1. A substrate processing apparatus, comprising
a liquid processing tank that stores a processing liquid and dips a plurality of substrates in the processing liquid to liquid-process the plurality of substrates;
a hydrophobizing gas supplier that supplies a gas of a hydrophobizing agent to the plurality of substrates after the liquid processing; and
a processing liquid supplier that supplies the processing liquid to the liquid processing tank, wherein
the processing liquid supplier includes an organic solvent supplier that supplies an organic solvent to the liquid processing tank,
the processing liquid supplier supplies the organic solvent that is supplied from the organic solvent supplier to the liquid processing tank, and
the liquid processing tank comprises a storage tank, an overflow tank, and a seal tank, the overflow tank is formed on a peripheral part of the storage tank at an upper end of the storage tank, and the seal tank is formed on a peripheral part of the overflow tank at an upper end of the overflow tank.

2. The substrate processing apparatus according to claim 1, wherein the processing liquid supplier further includes
a water supplier that supplies water to the liquid processing tank.

3. The substrate processing apparatus according to claim 2, wherein the processing liquid supplier further includes
a discharger that is arranged in an inside of the liquid processing tank and is connected to the organic solvent supplier and the water supplier.

4. The substrate processing apparatus according to claim 2, wherein the processing liquid supplier includes:
an organic solvent discharger that is connected to the organic solvent supplier and discharges the organic solvent to an inside of the liquid processing tank; and
a water discharger that is connected to the water supplier and discharges the water to an inside of the liquid processing tank.

5. The substrate processing apparatus according to claim 4, wherein the organic solvent discharger is arranged above the water discharger and discharges the organic solvent toward an inside of the liquid processing tank like a shower.

6. A substrate processing apparatus, comprising:
a liquid processing tank that stores a processing liquid and dips a plurality of substrates in the processing liquid to liquid-process the plurality of substrates;
a processing liquid supplier that supplies the processing liquid to the liquid processing tank;

a hydrophobizing gas supplier that supplies a gas of a hydrophobizing agent to the plurality of substrates; and
a controller that controls the processing liquid supplier and the hydrophobizing gas supplier, wherein
the processing liquid supplier includes
an organic solvent supplier that supplies an organic solvent to the liquid processing tank, and
the controller controls the processing liquid supplier in such a manner that the organic solvent that is supplied from the organic solvent supplier is supplied to the liquid processing tank to supply the organic solvent to the plurality of substrates that are arranged in the liquid processing tank, and subsequently, controls the hydrophobizing gas supplier in such a manner that the gas of a hydrophobizing agent is supplied to the plurality, of substrates,
wherein the liquid processing tank comprises a storage tank, an overflow tank, and a seal tank, the overflow tank is formed on a peripheral part of the storage tank at an upper end of the storage tank, and the seal tank is formed on a peripheral part of the overflow tank at an upper end of the overflow tank.

7. The substrate processing apparatus according to claim 6, comprising:
   a drying process tank that is arranged on an upper part of the liquid processing tank and executes a drying process for the plurality of substrates;
   a movement structure that lifts the plurality of substrates from the liquid processing tank and moves them to the drying process tank; and
   an organic solvent supplier that supplies a vapor of an organic solvent to an inside of the drying process tank, wherein
   the hydrophobizing gas supplier supplies the gas of a hydrophobizing agent to an inside of the drying process tank, and
   the controller controls the movement structure, after the organic solvent is supplied to the plurality of substrates that are arranged in the liquid processing tank, in such a manner that the plurality of substrates are lifted from the liquid processing tank, subsequently controls the hydrophobizing gas supplier in such a manner that the gas of a hydrophobizing agent is supplied to an inside of the drying process tank, and subsequently controls the organic solvent supplier in such a manner that a vapor of the organic solvent is supplied to an inside of the drying process tank.

8. The substrate processing apparatus according to claim 1, further comprising:
   a drying process tank that is arranged on an upper part of the liquid processing tank and executes a drying process for the plurality of substrates; and
   a movement structure that lifts the plurality of substrates from the liquid processing tank and moves them to the drying process tank, wherein
   the hydrophobizing gas supplier supplies the gas of a hydrophobizing agent to an inside of the drying process tank.

9. The substrate processing apparatus according to claim 8, further comprising
   an organic solvent supplier that supplies a vapor of an organic solvent to an inside of the drying process tank.

10. The substrate processing apparatus according to claim 1, wherein
    the processing liquid supplier includes:
      a chemical liquid supplier that supplies a chemical liquid that is used for a chemical liquid process for the plurality of substrates to the liquid processing tank; and
      a hydrophobizing liquid supplier that supplies a liquid of the hydrophobizing agent to the liquid processing tank.

11. The substrate processing apparatus according to claim 1, wherein
    the processing liquid supplier includes:
      a water supplier that supplies water that is used for a rinsing process for the plurality of substrates to the liquid processing tank; and
      a hydrophobizing liquid supplier that supplies a liquid of the hydrophobizing agent to the liquid processing tank.

12. A substrate processing method, comprising:
    a step of liquid-processing a plurality of substrates by dipping the plurality of substrates in a processing liquid that is stored in a liquid processing tank;
    a step of supplying a gas of a hydrophobizing agent to the plurality of substrates after the step of liquid-processing;
    a step of supplying the processing liquid to the liquid processing tank; and a step of supplying an organic solvent to the liquid processing tank, wherein
    the step of supplying an organic solvent includes supplying the organic solvent to the plurality of substrates that are arranged in the liquid processing tank,
    wherein the liquid processing tank comprises a storage tank, an overflow tank, and a seal tank, the overflow tank is formed on a peripheral part of the storage tank at an upper end of the storage tank, and the seal tank is formed on a peripheral part of the overflow tank at an upper end of the overflow tank.

13. The substrate processing method according to claim 12, further comprising
    a step of replacing water as the processing liquid that is attached to the plurality of substrates by the step of liquid-processing, with an organic solvent before the step of supplying a gas of a hydrophobizing agent, wherein
    the step of liquid-processing stores water as the processing liquid in the liquid processing tank to dip the plurality of substrates in the water that is stored in the liquid processing tank.

14. The substrate processing method according to claim 13, wherein
    the step of replacing discharges the organic solvent to the plurality of substrates with the water that is attached to the plurality of substrates by the step of liquid-processing like a shower.

* * * * *